United States Patent [19]
Agrawal et al.

[11] Patent Number: 5,818,254
[45] Date of Patent: Oct. 6, 1998

[54] MULTI-TIERED HIERARCHICAL HIGH SPEED SWITCH MATRIX STRUCTURE FOR VERY HIGH-DENSITY COMPLEX PROGRAMMABLE LOGIC DEVICES

[75] Inventors: Om P. Agrawal, Los Altos; Bradley A. Sharpe-Geisler, San Jose, both of Calif.

[73] Assignee: Advanced Micro Devices, Inc., Sunnyvale, Calif.

[21] Appl. No.: 459,230

[22] Filed: Jun. 2, 1995

[51] Int. Cl.$^6$ .......................... H03K 7/38; H03K 19/177
[52] U.S. Cl. ................................. 326/39; 326/41
[58] Field of Search .................. 326/38, 39, 41

[56] References Cited

U.S. PATENT DOCUMENTS

| | | | |
|---|---|---|---|
| 4,742,252 | 5/1988 | Agrawal | 307/465 |
| 4,758,746 | 7/1988 | Birkner et al. | 307/465 |
| 4,771,285 | 9/1988 | Agrawal et al. | 340/825.83 |
| 4,789,951 | 12/1988 | Birkner et al. | 364/716 |
| 4,931,671 | 6/1990 | Agrawal | 307/465 |
| 4,963,768 | 10/1990 | Agrawal et al. | 307/465 |
| 5,015,884 | 5/1991 | Agrawal et al. | 307/465 |
| 5,130,574 | 7/1992 | Shen et al. | 307/465 |
| 5,151,623 | 9/1992 | Agrawal | 307/465 |
| 5,191,243 | 3/1993 | Shen et al. | 307/465 |
| 5,204,556 | 4/1993 | Shankar | 307/465.1 |
| 5,220,214 | 6/1993 | Pedersen | 307/465 |
| 5,243,238 | 9/1993 | Kean | 326/41 |
| 5,258,668 | 11/1993 | Cliff et al. | 307/465 |
| 5,260,610 | 11/1993 | Pedersen et al. | 326/41 |
| 5,260,611 | 11/1993 | Cliff et al. | 326/41 |
| 5,371,422 | 12/1994 | Patel | 326/41 |
| 5,394,033 | 2/1995 | Tsui | 326/41 |
| 5,455,525 | 10/1995 | Ho et al. | 326/41 |
| 5,457,410 | 10/1995 | Ting | 326/41 |
| 5,521,529 | 5/1996 | Agrawal et al. | 326/38 |

FOREIGN PATENT DOCUMENTS 0 584 911  3/1994  European Pat. Off. .

94 10754  5/1994  WIPO .

OTHER PUBLICATIONS

Psing-Tsung Wang, et al., "A High Performance FPGA with Hierarchial Interconnection Structure", vol. 4 of 6, 30 May 1994, IEEE, pp. 239–242, XP000493185.

Stan Kopec et al., "Obtaining 70MHz Performance in the MAX Architecture", Electronic Engineering, vol. 63, No. 773, May 1991, pp. 69, 70, 72, 74.

Doug Conner, "PLD Architectures Require Scrutiny", EDN Electrical Design News, vol. 34, No. 20, Sep. 28, 1989, pp. 91, 93, 94, 96, 98, 100.

Steve Landry, "Application—Specific IC's Relying on RAM, Implement Almost any Logic Function", Electronic Design, vol. 33, No. 25, Oct. 1985, pp. 123–128, 130.

"Introduction to pLSI and ispLSI", *pLSI and ispLSI Databook & Handbook*, Lattice Semiconductor Corp., (undated), pp. 1–1 through 1–8.

(List continued on next page.)

*Primary Examiner*—Michael J. Tokar
*Assistant Examiner*—Richard Roseen
*Attorney, Agent, or Firm*—Skjerven, Morril, MacPherson, Franklin & Friel LLP; Edward C. Kwok

[57] ABSTRACT

A hierarchical switch matrix in a very high-density programmable logic device (CPLD) interconnects a multiplicity of programmable logic blocks in the CPLD. A new level of functionality coupled with high speed is provided by the hierarchical switch matrix. The hierarchical switch matrix includes three levels, a global switch matrix, a segment switch matrix and a block switch matrix. The block switch matrix provides a high speed signal path for signals within a programmable logic block. The segment switch matrix provides a high speed means of communication for signals within a segment, while the global switch matrix provides a high speed path for communication between segments. The hierarchical switch matrix of this invention provides a fixed, path independent, uniform, predictable and deterministic time delay for each group of signals routed through the hierarchical switch matrix.

41 Claims, 12 Drawing Sheets

OTHER PUBLICATIONS

"pLSI 1032 programmable Large Scale Integration", Rev. A., Lattice Semiconductor Corp., Jan. 1992, pp. 2–1 through 2–29.

"EPM7032 EPLD, High–Performance 32–Macrocell Device", Data Sheet, Altera Corp., Ver. 1, Dec. 1991, pp. 1–15.

Om P. Agrawal, "AMD's Next Generation MACH™3xx/4xx Family Breaks New PLD Density/Speed Barrier", *Conference Record, Wescon 92*, Nov. 1992, pp. 100–106.

Raymond Leung et al., "A 7.5 ns 350mW BiCMOS PAL®–type Device", Proceedings of the 1989 IEEE Custom Integrated Circuits Conference, May 1989 pp. 5.6.1–5.6.4.

MULTI-TIERED HIERARCHICAL HIGH SPEED SWITCH MATRIX STRUCTURE FOR VERY HIGH-DENSITY COMPLEX PROGRAMMABLE LOGIC DEVICES

BACKGROUND OF THE INVENTION

1. Field of the Invention

This invention relates generally to structures used in programmable logic circuits to interconnect two or more programmable logic blocks and more specifically to a high speed, hierarchical, scalable, multi-tiered switch matrix structure.

2. Description of Related Art

Interconnect architecture plays a crucial role for high-density, high performance programmable logic devices (PLDs). Over the past few years, essentially two types of architectures have emerged in the high-density programmable logic device arena, i.e., channeled array-based field programmable gate arrays (FPGAs) and segmented block-based electrically erasable PLDs, sometimes known as complex PLDs (CPLDs).

Conceptually, both segmented block-based CPLDs and FPGAs are programmable blocks with programmable interconnects. The fundamental difference between the two is in the architecture of the basic programmable block and the programmable interconnect structure. The basic goals are the same for both architectures—higher density, higher performance, broader application base, low cost, and easy to use solutions. However, the means used to achieve these goals and results are different. Each of the basic architectures has its own characteristics, strengths and weaknesses that emanates from the fundamental philosophy behind the architecture.

Channeled array-based FPGA architectures are characterized as an array of a large number of narrow, granular blocks, usually look-up table based or multiplexer-based logic, surrounded by a phalanx of uncommitted I/O blocks, and interconnected by distributed programmable interconnect structures. Segmented block-based CPLDs, on the other hand, are characterized as made up of a smaller number of large programmable logic blocks, that are usually sum-of-products based, interconnected by a centralized switch matrix or interconnect array.

Narrow granular blocks along with distributed interconnects inherently tend to have variable, non-uniform, path-dependent and somewhat unpredictable signal delays. Most channeled array-based FPGAs typically exhibit such signal delay characteristics. Most segmented block-based CPLDs tend to have fixed, more predictable, uniform and path-independent signal delays.

There are two distinct interconnect approaches for segmented block-based CPLDs, i.e., (i) a full cross-point programmable interconnect array (PIA) and (ii) a multiplexer-based, sparse switch matrix structure. The full cross-point programmable interconnect array (PIA) has the potential advantage of 100% global connectivity for all signals. All global signals are typically brought into a centralized interconnect array and the input signals for each programmable logic block in the CPLD are generated from this centralized array. Though the number of input signals for each block is a subset of the total number of global signals, each input signal can essentially be a function of all global signal sources at the same time. This global connectivity provides 100% connectivity and somewhat simplifies the "Routing" software. Also, since full global connectivity is always available, the routing software is not required to make any particularly intelligent decisions for routing signals.

The major disadvantages of the full cross-point PIA approach are speed degradation, larger die size, scalability with increased density, and wasting resources. A high-density CPLD incorporating a full cross-point programmable interconnect array tends to be (and is likely to be) slower and more expensive than a comparable CPLD with an optimized sparsely populated switch matrix. Since the full cross-point PIA receives feedback signals from all the internal logic macrocells of all logic blocks and all I/O pin feedback signals, the total number of input signals to the PIA is directly proportional to the total number and size of the logic blocks, and the number of I/O pins in the CPLD. As the number of logic blocks and I/O pins increase, the total number of signals routed to the PIA tends to increase rapidly.

As the density is increased to larger pin-count and higher-density logic, the PIA overhead becomes quite significant. Very large programmable interconnect arrays are inherently "slow" and have the additional overhead of a larger die area. While conceptually the same approach can be used for larger density devices, in reality the approach becomes very difficult to implement. Therefore, scalability to higher densities with the full cross-point PIA is questionable. Considering these limitations, it is not surprising that the PIA has been utilized primarily in smaller density CPLDs.

The other significant drawback of the PIA is its potential wastage of significant resources. The number of input signals needed for a block is usually significantly smaller than the device's full capability. As a result, most of the signal paths remain unutilized.

While the PIA approach strives for flexibility, the multiplexer-based sparse switch matrix approach focuses on speed, cost, optimized global connectivity, and die size. Like a PIA, the sparse central switch matrix receives input signals from all macrocells and I/O pins. All programmable logic block input signals, in turn, are derived from the sparse central switch matrix. However, each programmable logic block input line is judiciously connected to a subset of the total input lines of the sparse central switch matrix to provide optimized connectivity. Unlike the PIA approach, each programmable logic block input line is not connected to all input lines of the sparse central switch matrix. Rather, all the input lines of a programmable logic block combined have access to all signals on the input lines to the sparse central switch matrix.

The sparse central switch matrix approach tends to put some restrictions on the global connectivity. This approach provides particular combinations of input signals to a programmable logic block, and so restricts certain combinations of input signals. However, with an intelligently structured sparse central switch matrix, the global connectivity can be significantly enhanced and the routing restrictions can be significantly minimized.

The major benefits of the sparse central switch matrix approach are fast speed and predictable delays. Since all signals go through the sparse central switch matrix, the signal time delays are typically fixed, uniform, predictable, and path-independent.

Two of the most critical parameters affecting the routability of a multiplexer-based sparse central switch matrix are the number of input lines to each programmable logic block from the switch matrix and the multiplexer size. As the multiplexer size and the number of programmable logic block input lines increase, signal routability of the total device increases. Unfortunately, both a larger number of input lines and a larger multiplexer structure result in slower performance and bigger die size. Hence, there is a significant challenge for intelligently structuring both the block input size and the multiplexer size.

A major potential drawback of the single-tiered sparse central switch matrix approach is scalability to higher density devices. The number of signals entering the sparse central switch matrix tends to increase linearly with the number of macrocells and I/O pins. Thus, as the density is increased, the capacitive load for driving all signals to a central switch matrix is significantly increased. Also, to provide decent routability, with the goal of providing optimized global connectivity, either the number of programmable logic block input lines or the multiplexer size needs to be increased rapidly, resulting in slower and potentially more expensive devices. As a result, higher-density, block-based CPLDs tend to be comparatively slower speed than lower density block-based CPLDs.

In a prior art CPLD with 128 macrocells in eight programmable logic blocks, twenty-six programmable logic block input lines and a 16:1 multiplexer-based switch matrix were adequate to achieve optimized routability. Twenty-six input lines and a 16:1 multiplexer provide the ability to select the twenty-six programmable logic block input signals from a maximum of 416 different signals. For a device with 128 macrocell feedback signals and 64 I/O pin feedback signals, i.e., a total of 192 global feedback signals, this provides a maximum of 2.16 ways (416/192) of routing each signal.

In another prior art CPLD, the centralized switch matrix approach was extended to 256 macrocells with 128 I/Os in sixteen programmable logic blocks. Each programmable logic block had 34 input lines and a 36:1 multiplexer-based switch matrix for each block. This provided the ability to route a maximum of 1224 (34×36) signals. With 256 macrocells, 128 I/O pins, and fourteen dedicated input pin feedbacks, i.e., a total 398 global signals, this provided slightly more than three ways (1224/398) for routing each signal. Routability in this device was significantly more than the other prior art devices. A drawback of the larger switch matrix structure is obviously slower speed and increased die size.

While simplicity, speed, and smaller die size are the major advantages of the multiplexer-based switch matrix structure, the major limitations are limited programmable logic block input lines and multiplexer size. As the pin-count or the logic density is increased, providing optimal global connectivity with only a centralized switch matrix is difficult because the multiplexer size becomes increasingly larger to maintain the routability, which in turn degrades speed for all signals and complicates layout of the silicon die. Consequently, migration of logic designs to higher density CPLDs is possible only if the penalties in speed and die size are acceptable. An interconnect architecture for very high-density CPLDs with good speed, good signal routability characteristics, and uniform, predictable, fixed and path independent time delays is currently unavailable.

SUMMARY OF THE INVENTION

In accordance with the principles of this invention, a new hierarchical, multi-tiered, scalable, fast switch matrix in a very high-density programmable logic device(CPLD) provides a means for interconnecting a multiplicity of programmable logic blocks in the CPLD. As used herein, "very high-density programmable logic device" refers to a CPLD having in the range of 64 to 512 or more macrocells and 64 to 256 or more I/O pins. A new level of functionality coupled with high speed is provided by the hierarchical switch matrix of this invention. The hierarchical switch matrix breaks signal routing congestion in a systematic and simplified manner and so achieves increased routing flexibility and faster speed in a cost efficient manner. Since the hierarchical switch matrix significantly alleviates routing congestion (for handling large number of signals), the hierarchical switch matrix allows easier scalability of the architecture into higher densities without compromising speed.

According to the principles of this invention, the hierarchical switch matrix includes a multiplicity of switch matrices. For the purposes of signal routing through the hierarchical switch matrix, the CPLD is divided into segments where a segment preferably includes four or more programmable logic blocks. A segment may also include two, eight, sixteen or thirty-two programmable logic blocks, for example. Preferably, each segment includes the same number of programmable logic blocks, and all segments communicate with each other via the hierarchical switch matrix of this invention.

In one embodiment, a first programmable level of the hierarchical switch matrix, i.e., a first programmable switch matrix, receives signals from a programmable logic block, and signals from another hierarchical level of the hierarchical switch matrix. The first programmable switch matrix arbitrates which of the signals are passed through the switch matrix. In this embodiment, the signals passed through the first programmable switch matrix are provided to the programmable logic block. A signal path through the first programmable switch matrix to the programmable logic block defines a first hierarchical level. One important aspect of this invention, is that a signal can traverse the first hierarchical level independent of any other hierarchical level.

A second programmable level of the hierarchical switch matrix, i.e., a second programmable switch matrix, is coupled to the first programmable switch matrix. A signal path through the second programmable switch matrix and the first programmable switch matrix to the programmable logic block defines another hierarchical level. In one embodiment, the coupling of the second programmable switch matrix to the first programmable switch matrix is a direction connection and so the second programmable switch matrix is a programmable segment switch matrix. In another embodiment, the coupling of the second switch matrix to the first switch matrix is through another programmable switch matrix.

In the embodiment, where the second programmable switch matrix is a programmable segment switch matrix, the segment switch matrix programmably connects and disconnects programmable logic blocks within a segment. Thus, one programmable logic block within a segment communicates with another programmable logic block through the segment switch matrix. The segment switch matrix also programmably provides signals to a third level of the hierarchical switch matrix, and programmably receives signals from the third level. Thus, a programmable switch matrix arbitrates between whether signals from the a third hierarchical level or signals from the second hierarchical level are routed to the first hierarchical level, e.g., to the first programmable switch matrix.

A signal path through the segment switch matrix and the block switch matrix to a programmable logic block defines a second hierarchical level. Another important aspect of this invention, is that a signal can traverse the second and first hierarchical levels independent of any higher hierarchical level.

The third hierarchical level includes a third programmable switch matrix, i.e., a programmable global switch matrix programmably interconnects segments. Thus, a programmable logic block in one segment communicates with a programmable logic block in another segment through the programmable global switch matrix. A signal path through the global switch matrix, a segment switch matrix and a block switch matrix to a programmable logic block defines a third hierarchical level.

According to the principles of this invention, each hierarchical level has a characteristic time delay. The time delay for a given level is uniform, predictable, and deterministic.

In one embodiment, the global switch matrix is implemented as a bus and demultiplexers. Each line of the global switch matrix bus is coupled to a segment switch matrix line by a programmable demultiplexer. In one case, the segment switch matrix line is connected to an input terminal of the programmable demultiplexer; a first output terminal of the programmable demultiplexer is connected to a line in the global switch matrix bus; and a second output terminal of the programmable demultiplexer is connected to another line in the global switch matrix bus.

In another case, a line in the global switch matrix is connected to an input terminal of the programmable demultiplexer; a first output terminal of the programmable demultiplexer is connected to a segment switch matrix line; and a second output terminal of the programmable demultiplexer is connected to another segment switch matrix line.

Each programmable segment switch matrix has its own interconnect to the global switch matrix bus. Thus, additional segments can be added to a CPLD by simply adding another interconnect on the global switch matrix bus.

In this embodiment, each segment switch matrix also is implemented as a bus and programmable demultiplexers. A feedback line from a programmable logic block in the segment is connected to an input terminal of a programmable demultiplexer. The set of demultiplexers associated with the feedback signals from a programmable logic block define a strip of the segment switch matrix. Thus, the number of strips is the same as the number of programmable logic blocks in a segment. Further, since a strip receives local feedback signals from a single programmable logic block, the strips of the programmable segment switch matrix are independent.

Each programmable block switch matrix is implemented as a plurality of programmable multiplexers, in one embodiment. Each programmable multiplexer is connected to a plurality of programmable block switch matrix input lines and to a programmable block switch matrix output line.

The hierarchical switch matrix is structured to break the routing congestion. If a signal from a programmable logic block needs a fast, local communication path to other signals within the same programmable logic block, the communication path is provided through the programmable block switch matrix. Thus, it is not necessary to route the signal through the segment switch matrix. This results in both fast speed and less routing congestion in the segment switch matrix. Similarly, if signals within a segment need to communicate with other segments, these signals use the programmable global switch matrix.

All the switch matrices are structured for fast speed, low cost and optimized connectivity. Also, the hierarchical approach allows each level of the hierarchical switch matrix to be small, fast and flexible. In one embodiment, the delay through the block switch matrix is in the range of 0.5 to 1.5 nanoseconds (ns); the delay through the segment switch matrix is in the range of 1 to 2 ns; and the delay through the global switch matrix is in the range of 1 to 3 ns.

Moreover, in one embodiment, all the segment switch matrices within a CPLD are identical, and all the block switch matrices are identical. Thus, a CPLD with the hierarchical switch matrix of this invention can be configured as multiple independent CPLDs that are interconnected by the global switch matrix. Consequently, instead of having to layout a circuit board to support multiple CPLDs and route the signals among the various CPLDs, the CPLD of this invention can be used. The replacement of the circuit board layout with the programmability of the global switch matrix greatly enhances the designer's ability to quickly and effectively implement changes. Consequently, the CPLD of this invention reduces the time-to-market of equipment utilizing two or more interconnected CPLDs.

Unlike the prior art CPLDs with a single tier switch matrix that compromised speed for higher density, the hierarchial high speed switch matrix provides a new level of architectural flexibility with faster speed. Generally, in comparison to the prior art switch matrices, the hierarchical switch matrix of this invention provides increased signal routing flexibility and scalability to higher densities without encountering signal routing limitations.

DETAILED DESCRIPTION

In accordance with the principles of this invention, a new hierarchical switch matrix 160 (FIG. 1) in a very high-density complex programmable logic device (CPLD) 100 programmably interconnects a multiplicity of programmable segments 101 to 104 that each includes a plurality of programmable logic blocks, e.g, in this embodiment four programmable logic blocks 101-A to 101-D, 102-A to 102-D, 103-A to 103-D, and 104-A to 104-D, respectively. In this embodiment, each of the programmable logic blocks is a 32V16-like programmable logic block that has thirty-two input lines, sixteen macrocells, and sixteen I/O pins.

Figure 1:
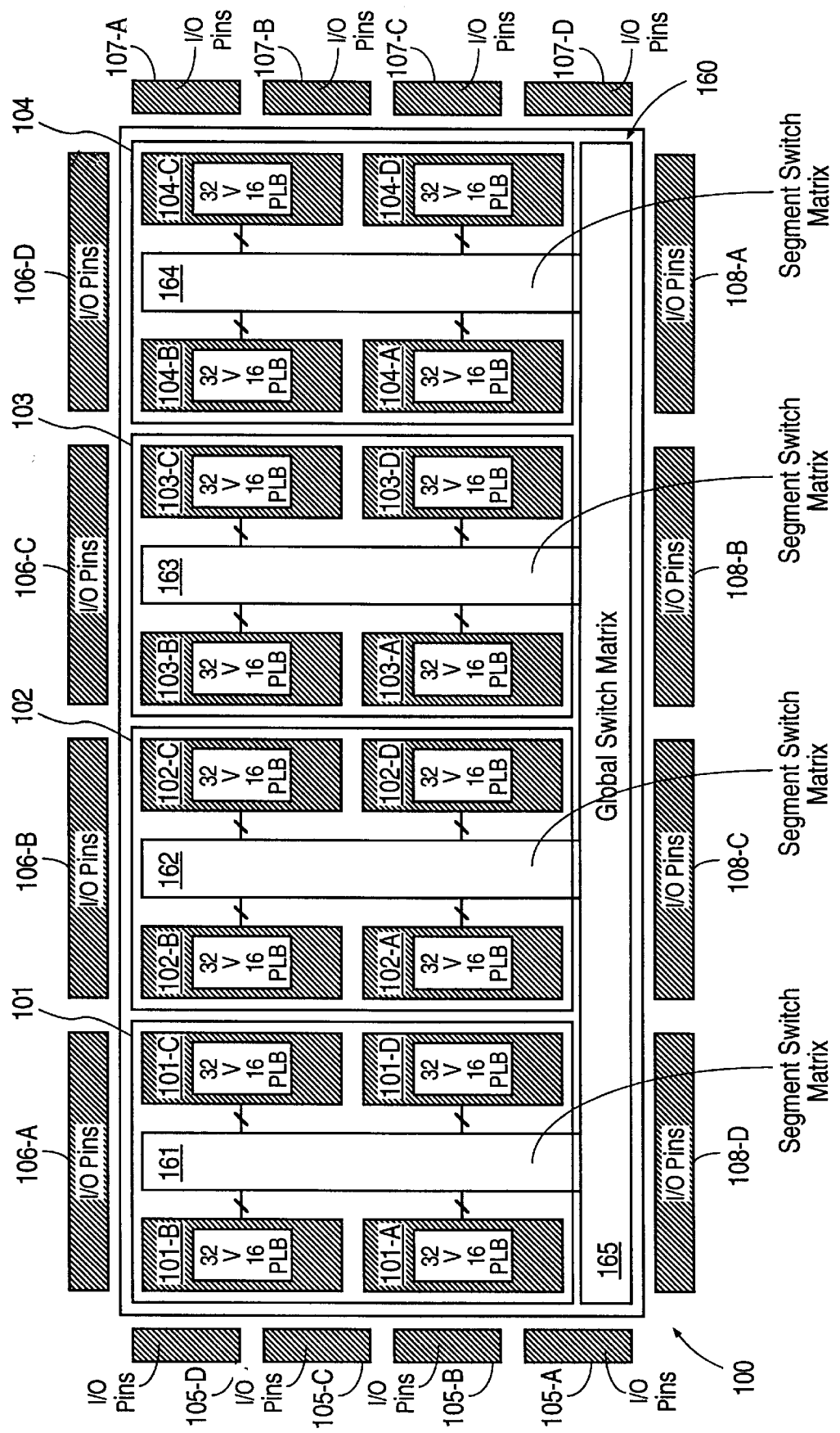
FIG. 1 is a block diagram of a very high-density programmable logic device (CPLD) including the hierarchical switch matrix of this invention.

Two levels of hierarchical switch matrix 160 are illustrated in FIG. 1, i.e., a plurality of programmable segment switch matrices 161 to 164, and a programmable global switch matrix 165. In another embodiment, as described more completely below, a plurality of block switch matrices are included in hierarchical switch matrix 160. The various levels of hierarchy in hierarchical switch matrix 160 and CPLD 100 are defined by the signal paths through CPLD 100. Each hierarchical signal path has a predetermined time delay associated with the path.

According to the principles of this invention, all programmable logic blocks within a segment communicate with each other through the programmable segment switch matrix, sometimes referred to as the segment switch matrix, for that segment. For example, programmable logic blocks 101-A to 101-D communicate with each other through segment switch matrix 161. Thus, the signal path through segment switch matrix 161 to programmable logic block 101-D defines a hierarchical level within PLD, e.g., intra-segment signal paths are one level of hierarchy.

Global switch matrix 165 programmably interconnects and disconnects segment switch matrices 161 to 165 so that signals can be communicated between programmable logic blocks in different segments. Thus, a programmable logic block in one segment communicates with a programmable logic block in another segment using programmable global switch matrix 165, sometimes referred to as global switch matrix 165. For example, programmable logic block 102-A in segment 102 drives a signal onto programmable segment switch matrix 162 which provides the signal to global switch matrix 165. Global switch matrix 165 routes the signal to segment switch matrix 161, which in turn provides the signal to programmable logic block 101-B. Thus a signal path through global switch matrix 165 to a segment switch matrix to a programmable logic block defines another level of hierarchy within CPLD 100.

Signal transfer through hierarchial switch matrix 160 is very rapid. Hierarchial switch matrix 160 provides numerous programmably selectable signal path combinations to each programmable logic block, and so has significant signal path flexibility.

Hierarchical switch matrix 160 has a fixed, path independent, uniform, predictable and deterministic time delay through each level of hierarchical switch matrix 160. Thus, the speed of CPLDs containing hierarchical switch matrix 160 is dependent on the signal path though hierarchical switch matrix 160, i.e, the number of levels of hierarchical switch matrix 160 traversed by the signal.

Each segment 101 to 104 in CPLD 100 is modular. As explained more completely below, the modularity results in significantly easier scalability to higher densities. Specifically, global switch matrix 165 is easily extended to support any number of segments with no change in the basic global switch matrix architecture. Each segment is completely independent and has its own programmable interconnect with global switch matrix 165.

Further, the modular segment architecture permits CPLD 100 to be configured as multiple independent CPLDs that are interconnected by global switch matrix 165. Consequently, instead of laying out a circuit board to support multiple CPLDs and routing the signals among the various CPLDS, CPLD 100 of this invention can be used. The replacement of the circuit board layout with the programmability of global switch matrix 165 greatly enhances the designer's ability to quickly and effectively implement changes. Consequently, CPLD 100 of this invention reduces the time-to-market of circuits utilizing two or more interconnected CPLDs.

Prior art CPLDs with a single tier multiplexer-based switch matrix were optimized for speed with gate densities in the range of about 32 to 256 macrocells. According to the principles of this invention, hierarchical switch matrix 160 is suitable for CPLDs having gate densities in the range of about 64 to about 500 or more macrocells. Specifically, as used herein, "very high-density programmable logic device" refers to a CPLD having in the range of 64 to 512 or more macrocells and 64 to 256 or more I/O pins.

In FIG. 1, for clarity the specific coupling between the I/O pins and the programmable logic blocks in a segment is not illustrated. However, the pluralities of I/O pins 105-A to 105-D are coupled to programmable logic blocks 101-A to 101-D, respectively; the pluralities of I/O pins 106-A to 106-D are coupled to programmable logic blocks 102-A to 102-D, respectively; the pluralities of I/O pins 107-A to 107-D are coupled to programmable logic blocks 103-A to 103-D, respectively; and the pluralities of I/O pins 108-A to 108-D are coupled to programmable logic blocks 104-A to 104-D, respectively.

Unlike the prior art CPLDs with a single tier centralized sparse switch matrix that compromised logic flexibility for speed, hierarchial switch matrix 160 provides a new level of architectural flexibility and speed. Generally, in comparison to the prior art centralized sparse switch matrices, hierarchical switch matrix 160 provides increased signal routing flexibility and scalability to higher densities without encountering signal routing limitations.

A more detailed description of CPLDs including hierarchical switch matrix 160 is provided in copending, commonly filed, and commonly assigned U.S. patent application Ser. No. 08/459,960, entitled "VERY HIGH-DENSITY COMPLEX PROGRAMMABLE LOGIC DEVICES WITH A MULTI-TIERED HIERARCHICAL SWITCH MATRIX AND OPTIMIZED FLEXIBLE LOGIC ALLOCATION" of Om P. Agrawal that was filed on Jun. 2, 1995, now U.S. Pat. No. 5,521,529 and is incorporated herein by reference in its entirety.

Figure 2:
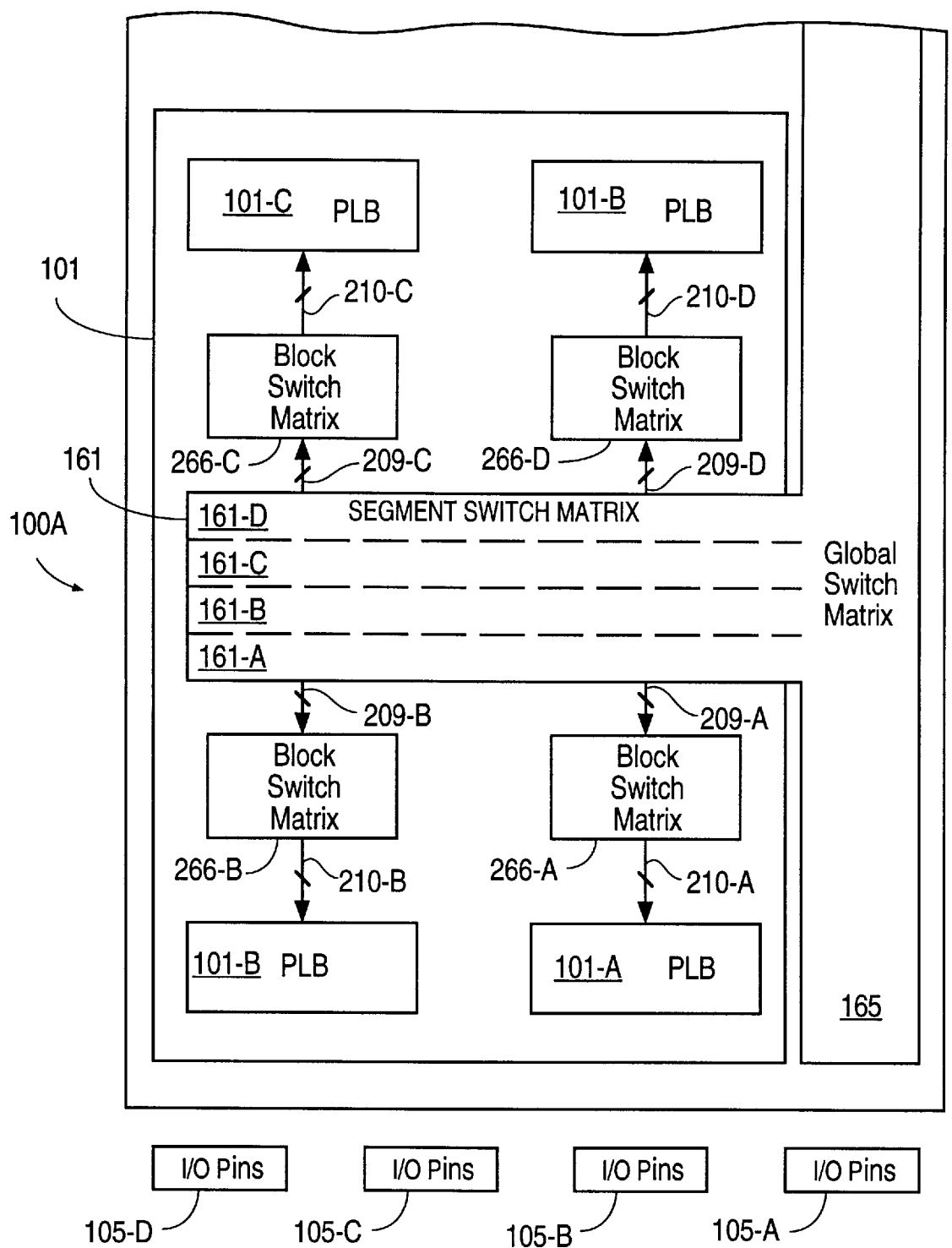
FIG. 2 is a more detailed block diagram of the CPLD of FIG. 1 that illustrates the global switch matrix, segment switch matrices, and the block switch matrices that comprise the hierarchical switch matrix of this invention.

FIG. 2 is a block diagram of one module, i.e., segment 101, of a very high-density CPLD 100A that includes a three-level hierarchical switch matrix 160 of this invention. Hierarchical switch matrix 160, in this embodiment, includes global switch matrix 165, segment switch matrix 161, as well as each of the other segment switch matrices illustrated in FIG. 1, and a plurality of programmable block switch matrices that includes programmable block switch matrices 266-A to 266-D. In view of the modularity of the segments, only the portion of hierarchical switch matrix 160 that is associated with segment 101 is considered. The architecture of hierarchical switch matrix 160 for each of the other segments will be apparent to those skilled in the art in view of this disclosure.

As illustrated in FIG. 2, each programmable logic block 101-A to 101-D has associated with that programmable logic block a programmable block switch matrix 266-A to 266-D, respectively. Herein, elements with the same alphanumeric character in the reference numeral are associated elements. Programmable block switch matrices 266-A to 266-D are a first level within hierarchical switch matrix 160.

Each programmable block switch matrix, sometimes referred to as a block switch matrix, has a plurality of output lines that provide a plurality of input signals on input lines to the associated programmable logic block, e.g., output lines 210-A of block switch matrix 266-A provide input signals on input lines of programmable logic block 101-A. Each programmable block switch matrix 266-A to 266-D receives a plurality of input signals from segment switch matrix 161 over lines 209-A to 209-D, respectively. Each programmable block switch matrix also receives a plurality of feedback signals from the programmable logic blocks and I/O pins associated with the block switch matrix, as described more completely below.

In one embodiment, as explained more completely below, each of a plurality of programmable logic macrocells in programmable logic block 101-A, e.g., sixteen programmable output logic macrocells, provide feedback signals to both block switch matrix 266-A (for fast local feedback path) and to segment switch matrix 161. All feedback signals of a programmable logic block 101-A, i.e., all I/O pins feedback signals, and all macrocell feedback signals, communicate directly only with block switch matrix 266-A and with segment switch matrix 161. For clarity the feedback signals are not shown in FIG. 2.

A programmable logic block 101-A and an associated block switch matrix 266-A define a first hierarchical level in CPLD 100A. A signal in CPLD 100 that is generated at this first hierarchical level can be fed back to the first hierarchical level independent of any other hierarchical levels in CPLD 100, i.e, a signal from programmable logic block 101-A can be fed back through block switch matrix 266-A to block 101-A. Also, a signal from an I/O pin can be passed through the first hierarchical level to another I/O pin associated with block 101-A independent of any other hierarchical levels in CPLD 100, i.e., from an I/O pin to block switch matrix 266-A to block 101-A to another I/O pin associated with block 101-A. Thus, one important aspect of this invention, is that a signal can traverse the first hierarchical level independent of any other hierarchical level in CPLD 100.

Thus, a programmable block switch matrix, e.g. block switch matrix 266-A, is a high speed programmable switch matrix for routing a signal from one I/O pin in I/O pins 105-A through programmable logic block 101-A to another I/O pin in I/O pins 105-A. The signal path has a pin-to-pin time delay that is comparable with low-density programmable logic devices that are referred to as PAL devices. (PAL is a registered U.S. trademark of Advanced Micro Devices of Sunnyvale, Calif.) Moreover, the signal time delay through a block switch matrix is preferably a fixed, uniform, deterministic, and predictable, and is a characteristic of the hierarchical level.

An important aspect, as explained above, is that the time delay through segment switch matrix 161 preferably is also a fixed, predictable, uniform, and deterministic, as is the time delay through global switch matrix 165. Consequently, the time delay for the signal path from a pin associated with one programmable logic block through segment switch matrix 161, block switch matrix 266-A, and programmable logic block 101-A back to another pin associated with that programmable logic block is also a fixed, predictable, uniform, and deterministic, and is characteristic of the second hierarchical level. Alternatively, on the second hierarchical level, a signal from a first programmable logic block 101-B can be fed back through segment switch matrix 161 and block switch matrix 266-A to programmable logic block 101-A with the time delay characteristic of the second hierarchical level.

Also, a signal from a programmable logic block 101-A in a first segment 101, or an I/O pin associated with programmable logic block 101-A, to segment switch matrix 161 to global switch matrix 165 to another segment switch matrix, block switch matrix and programmable logic block in another segment defines a third hierarchical level of CPLD 100 with a characteristic time delay.

One important aspect of this embodiment of hierarchical switch matrix 160 that breaks routing congestion is that none of the feedback signals from the macrocells and I/O pins connect directly to global switch matrix 165. These feedback signals communicate with global switch matrix 165 only via segment switch matrix 161. This architecture for hierarchical switch matrix 160 maintains the modularity of each segment and so is important to the scalability that can be obtained with hierarchical switch matrix 160.

As illustrated in FIG. 2, each segment switch matrix 161 includes a multiplicity of strips 161-A to 161-D, i.e., the multiplicity includes one strip for each programmable logic block in the segment. The lines in a strip are programmably connectable and disconnectable from the input lines to each block switch matrix 266-A to 266-D. Each strip, for example, strip 161-A, receives input signals only from the corresponding programmable logic block, e.g, programmable logic block 101-A, and programmably connects and disconnects the input signals to output lines of segment switch matrix 161. In this embodiment, each strip includes programmable 1:n de-multiplexers that can provide each input signal up to n paths through segment switch matrix 161, as explained more completely below. The strip architecture of a segment switch matrix facilitates scaling a segment for various numbers of programmable logic blocks.

Figure 3:
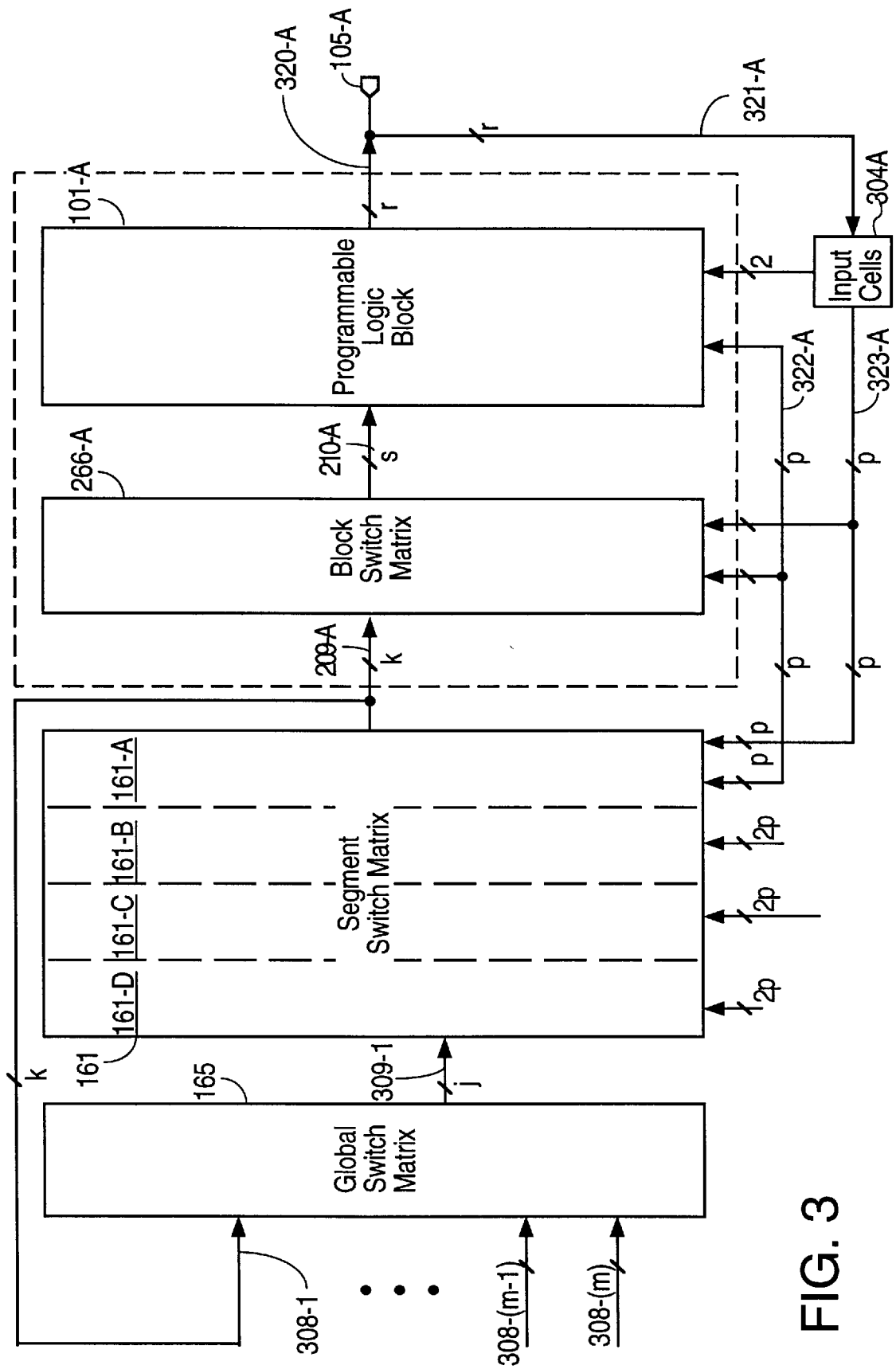
FIG. 3 is a detailed block diagram of the hierarchical switch matrix of FIG. 2 that illustrates one embodiment of the feedback paths in the CPLD.

FIG. 3 is a more detailed block diagram of the three-level hierarchical switch matrix 160 of FIG. 2 that illustrates (i) the local feedback signals from each programmable logic block; and (ii) the interconnections between the various levels of hierarchical switch matrix 160 and each programmable logic block. In FIG. 3, only programmable logic block 101-A in segment 101 (FIGS. 1 and 2) is illustrated. In view of the symmetry within a segment and the modularity of the segments, the connections for other programmable logic blocks within the segment, and the connections and feedback lines in each of the other segments will be apparent to those skilled in the art in view of the following discussion.

Programmable logic block 101-A drives r output lines 320-A that are connected to I/O pins 105-A. Feedback lines 321-A carry the signals on I/O pins 105-A to input cells 304-A. Programmable logic block 101-A also generates p feedback signals on lines 322-A that are provided directly to block switch matrix 266-A and to strip 161-A in segment switch matrix 161.

In the CPLD shown, input cells 304-A are simply a straight pass through so that the signals on r input lines 321-A are passed directly to p output lines 323-A to block switch matrix 266-A and to segment switch matrix 161. In addition, one I/O pin drives a cell in input cells 304-A that passes one of (i) the signal on one I/O pin; and (ii) a registered/latched output signal that is driven by the signal on the one I/O pin to an input line of a logic allocator in programmable logic block 101-A. Similarly, another I/O pin drives another cell in input cells 304A that passes one of (i) the signal on the another I/O pin; and (ii) a registered/latched output signal that is driven by the signal on the another I/O pin to another input line of the logic allocator in programmable logic block 101-A. Of course, these two cells could be eliminated, and then input cells 304A would only pass all I/O pin feedback signals directly therethrough.

In another CPLD (not shown), the two cells that drive router elements are eliminated, and each input line in r input lines 321-A either (i) drives directly one of (p/2) output lines in output lines 323-A to block switch matrix 266-A and to segment switch matrix 161, or (ii) drives a programmably configurable storage element. Each programmably configurable storage element drives one of the other (p/2) output lines in output lines 323-A to block switch matrix 266-A and to segment switch matrix 161.

In addition to the 2*p input lines to each strip of segment switch matrix 161 from the associated programmable logic block in the segment, segment switch matrix 161 can receive j signals from global switch matrix 165 on lines 309-1. Thus, segment switch matrix 161 can receive a total of j plus n*2*p input signals where n is the number of programmable logic blocks in a segment. For a 32V16-like programmable logic block 101-A that has 32 input lines, sixteen macrocells, and 16 I/O pins, p is 16 and, as shown in FIG. 1, n is 4. Thus, the number of within segment signals, i.e, intra-segment signals, to segment switch matrix is 128 (4*2*16). For this particular programmable logic block configuration, j is also taken as 128 input lines. Consequently, in this embodiment, each segment switch matrix has the ability to receive up to 50% of the input signals from global switch matrix 165.

Figure 4A:
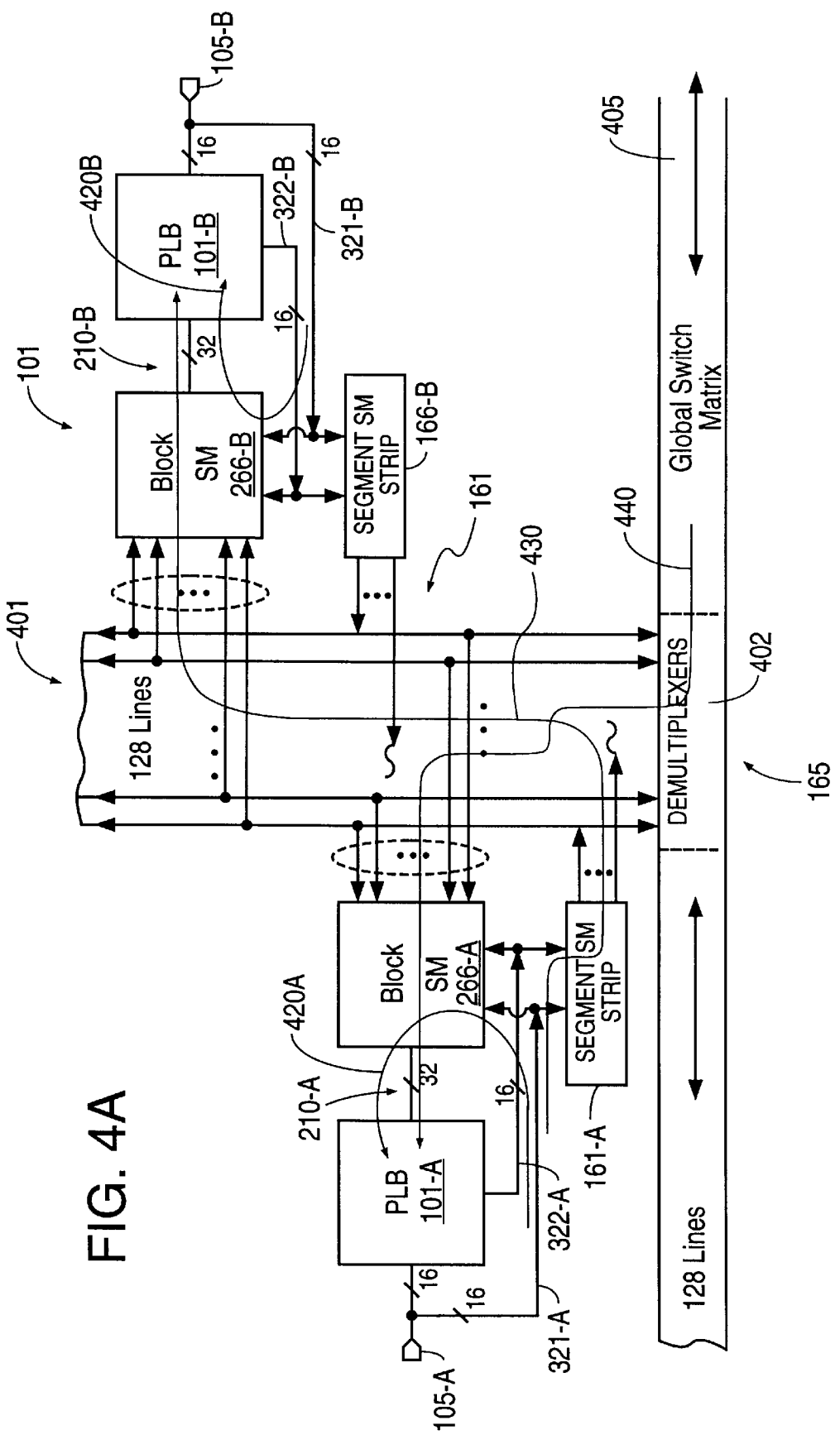
FIGS. 4A and 4B illustrate the programmable interconnect structure between the segment switch matrices and the global switch matrix of this invention as well as the overall architectural layout of one embodiment of the hierarchical switch matrix of this invention.
Figure 4B:
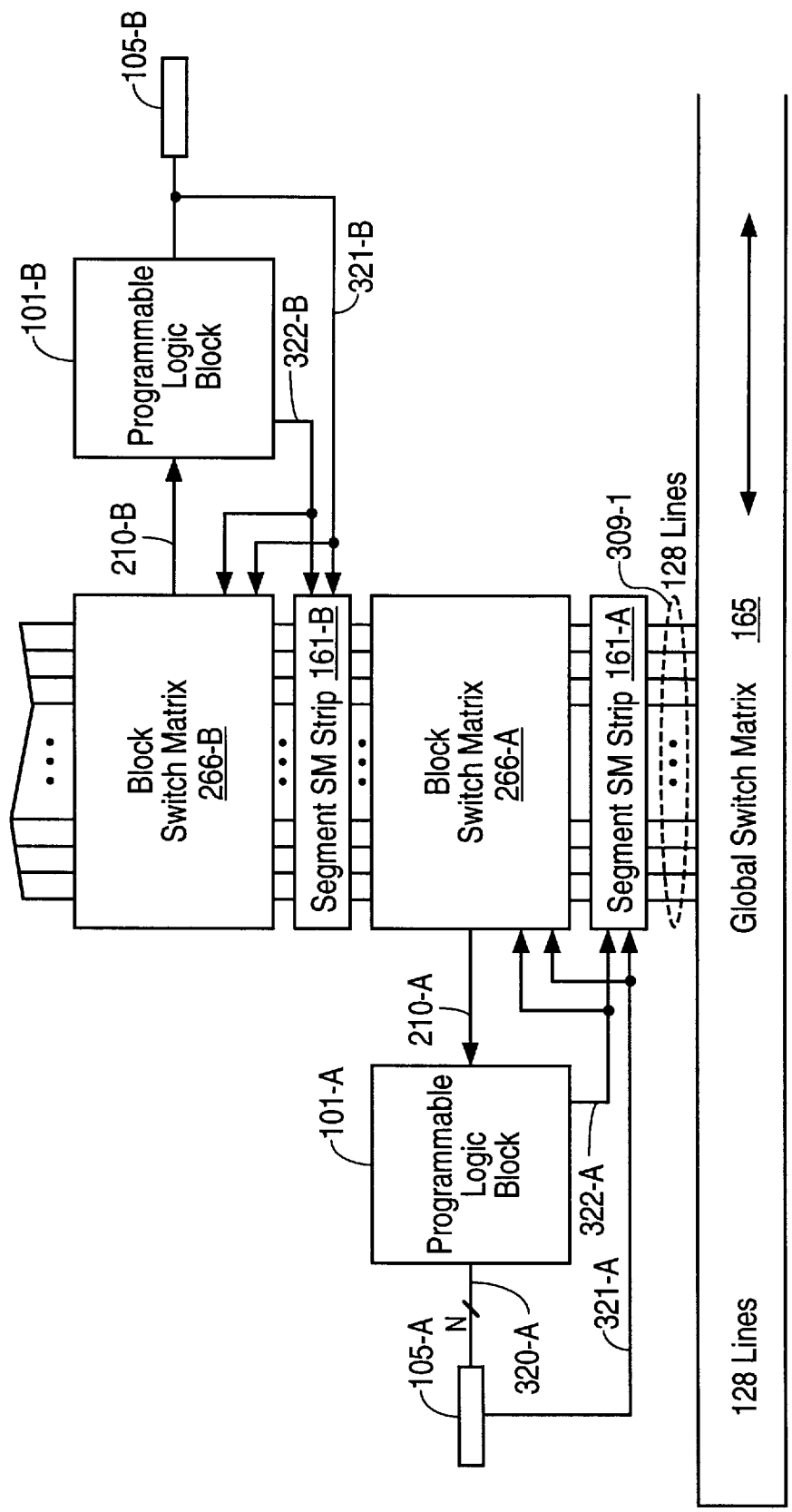

In this embodiment, segment switch matrix 161 drives k input lines 209-A to block switch matrix 266-A. In addition, segment switch matrix 161 drives k lines 308-1 that are input lines to global switch matrix 165. In one embodiment, lines 309-1 and 308-1 are the same lines and global switch matrix 165 and segment switch matrix 161 are interconnected by a k line bidirectional bus. Thus, k is equal to j and so segment switch matrix 161 has 128 output lines 209-A that are input lines to block switch matrix 266-A. This architecture is illustrated in FIGS. 4A and 4B.

In this embodiment, segment switch matrix 161 is programmably configured to select 128 signals to drive the 128 input lines to each block switch matrix from a total of the 256 signals on the input lines to segment switch matrix 161. Thus, segment switch matrix 161 receives a maximum of 128 intra-segment signals plus another 128 signals from the global switch matrix 165, and provides 128 input signals to each block switch matrix in a segment. Herein, the particular number of signals and lines in a switch matrix are illustrative only and are not intended to limit the invention to the particular numbers given.

Segment switch matrix 161 could be implemented using programmable multiplexers. Conceptually, each segment switch matrix output line could be connected to one of a 4:1 or 6:1 or 8:1 programmable multiplexer to provide 2 ways, 3 ways or 4 ways of signal routability, respectively.

However, as indicated above, segment switch matrix 161 is preferably implemented using a plurality of programmable demultiplexers.

As previously indicated, for programmable logic block 101-A with sixteen macrocell feedback lines 322-A and sixteen I/O pin feedback lines 323-A, each strip 161-A to 161-D of segment switch matrix 161 has a total of 32 input lines that carry feedback signals from the associated local block for a total of 128 lines. In general, each strip has one input line for each macrocell feedback line and each I/O pin feedback line of the programmable logic block associated with the strip, i.e, one line for each local feedback signal. Each strip is designed to be completely independent of the other strips in a segment switch matrix.

Each input line to a strip is connected to the input terminal of a programmable demultiplexer. Each output terminal of the programmable demultiplexer is connected to a different line in a segment switch matrix bus. The number of demultiplexer output terminals connected to lines in the segment switch matrix bus determines the number of paths through the segment switch matrix for each input signal.

However, each strip needs to accommodate the situation in which a local feedback signal is not connected to the segment switch matrix bus and the signal from the global switch matrix is passed through the segment switch matrix to a programmable logic block. Here, local is used to distinguish feedback signal generated within the segment from signals provided to the segment through global switch matrix 165. Consequently, two signal paths through segment switch matrix strip for each local feedback signal plus the option of no connection requires a 1:3 programmable demultiplexer. In this case, the programmable demultiplexer has two states. In the first state, the programmable demultiplexer programmably connects the input terminal to one output terminal and disconnects the input terminal from all other output terminals. In the second state, the programmable demultiplexer disconnects the input terminal from all the demultiplexers output terminals connected to the segment switch matrix bus.

Similarly, three-way signal routability plus the option of no connect requires a 1:4 programmable demultiplexer. In this embodiment, to provide three way routability for each signal and a no connection option, segment switch matrix 161 utilizes 1:4 programmable demultiplexers, one for each input line from a macrocell or an I/O pin.

The use of demultiplexers makes the independent strip architecture of segment switch matrix 161 possible. This strip architecture is significant because, as explained above, the various strips are independent. Thus, the strip architecture is easily scalable and can easily accommodate changes in the number of feedback lines as well as changes in the number of programmable logic blocks per segment.

As explained above in this embodiment, segment switch matrix 161 drives 128 input lines to each block switch matrix, which in FIG. 3 are lines 209-A to block switch matrix 266-A. Block switch matrix 266-A also has 2*p local feedback input lines that include p feedback lines 322-A from the macrocells in programmable logic block 101-A, and p feedback lines 323-A that carry signals on I/O pins 105-A. In another embodiment, the number of I/O pin feedback lines can be different from the number of macrocell feedback lines.

Thus, in this embodiment, the output signals from block switch matrix 266-A can be programmably selected from: (i) direct feedback signals from programmable logic block 101-A; (ii) direct feedback signals from I/O pins 105-A; and (iii) signals from segment switch matrix 161. Block switch matrix 266-A drives the selected output signals on S input lines 210-A to programmable logic block 101-A. The particular number of input lines S to a programmable logic block is a function of the number of macrocells in the block. For example, preferably there are at least two input lines for each logic macrocell.

In this embodiment, block switch matrix 266-A is a multiplexer-based structure. In each CPLD, the multiplexer size is appropriately selected for a given number of programmable logic block input lines 210-A to provide a predetermined routability. The appropriate multiplexer size for block switch matrix 266-A is given by:

$$\text{Mux size} = \text{Integer}\{((\text{Total no. of input signals to block switch matrix}) \times (\text{Number of signal paths through block switch matrix}))/(\text{No. of block switch matrix output lines})\}$$

where Integer takes the integer value of the expression. One multiplexer is used for each output line of block switch matrix 266-A.

Thus, for block switch matrix 266-A and a 32V16 like programmable logic block 101-A, the total number of input signal lines to block switch matrix 266-A is 160 lines (128 lines 210-A from segment switch matrix 161 and 32 local block feedback lines 322-A and 323-A). If a minimum 2 ways of routability, i.e., two signal paths through block switch matrix 266-A, is desired for each input signal, and block switch matrix has thirty-two output lines 210-A, the block switch matrix multiplexer size is:

160*2/32=10:1

Note that this is just an example. Other multiplexer sizes can easily be accommodated for a particular routability. A larger programmable multiplexer size results in increased routability, and a smaller programmable multiplexer size results in decreased routability.

In the above, embodiment with a 10:1 programmable multiplexer, each of the signals from segment switch matrix 161 and each of the direct local feedback signals on lines 323-A and 322-A has two signal paths through block switch matrix 266-A. However, in another embodiment, each input signal to block switch matrix 266-A does not have the same number of paths through block switch matrix 266-A. The use of a smaller multiplexer and a different number of signal paths for different signals provides a means to optimize the die area used by block switch matrix 266-A.

Specifically, in one embodiment, a plurality of 8:1 programmable multiplexers are used with the thirty-two output lines so that there are a total of 256 signal paths. Each of the block feedback signals on lines 322-A and 323-A are provided to an input terminal of a different programmable multiplexer so that each of these signals has a single path through block switch matrix 266-A. Since thirty-two of a possible 256 paths through block switch matrix 266-A are for local feedback signals, 224 paths are available for the 128 input signals from segment switch matrix 161 on lines 209-A. Thus, these signals can have one, two or more paths through the block switch matrix. The use of programmable 8:1 multiplexers requires less silicon than the 10:1 multiplexers in the previous embodiment.

The output signals from block switch matrix 266-A can be programmably selected from: (i) direct feedback signals from programmable logic block 101-A; (ii) direct feedback signals from I/O pins 105-A; and (iii) signals from segment switch matrix 161.

Global switch matrix 165 receives a plurality of signals from each segment switch matrix in the CPLD. Global switch matrix 165 is implemented as a bus that is programmably connected to and disconnected from each of the segment switch matrices through programmable demultiplexers.

In this embodiment, global switch matrix 165 is a 128-line bus and a plurality of programmable demultiplexers. The 128-line bus is connected to segment switch matrix 161 by a first programmable demultiplexer; to segment switch matrix 162 by a second programmable demultiplexer; to segment switch matrix 163 by a third programmable demultiplexer; and to segment switch matrix 164 by a fourth programmable demultiplexer.

For example, to achieve two-way routability plus the option of no connect capability in global switch matrix 165, each line in the 128-line bus is an input line to a 1:3 programmable demultiplexer where two output terminals of the programmable demultiplexer are connected to two lines in the 128-line bus of the segment switch matrix and the third output terminal has no connection. To achieve three-way routability plus no connect, the 128-lines in the global switch matrix 165 matrix are connected via 1:4 demultiplexers to the 128 line bus in the segment switch matrix. In another embodiment, a line in the segment switch matrix bus drives the input terminal of a demultiplexer in global switch matrix 165 and the output terminals are each connected to one line in the bus of global switch matrix 165.

FIG. 4A is another representation of hierarchical switch matrix 160, as presented in FIGS. 1 to 3. In FIG. 4A, the input cells are taken as a straight pass through and so are not shown. The programmable connections in the various demultiplexers and multiplexers of hierarchical switch matrix 160 are implemented using pass transistors. The 128 input lines to each block switch matrix are driven by segment switch matrix bus 401 in segment switch matrix 161. The 128-lines in segment switch matrix bus 401 are connected and disconnected through demultiplexers 402 to the 128-line global switch matrix bus 405. Similarly, local feedback lines from I/O pins and macrocells drive input lines of multiplexers in the block switch matrix and input lines of demultiplexers in the segment switch matrix strip. The output lines of the demultiplexers in the segment switch matrix strip are connected to selected lines in segment switch matrix bus 401. The lines of segment switch matrix bus 401 for each strip are selected so as to optimize signal routability. However, the particular selection for a given strip is not an important aspect of this invention.

FIG. 4A illustrates the various hierarchical levels in CPLD 100A. Signal paths 420-A and 420-B through a block switch matrix and a programmable logic block define a first hierarchical level. Signal path 430 through segment switch matrix 161, block switch matrix 266-B and programmable logic block 101-B defines a second hierarchical level. Signal path 440 from a segment switch matrix to global switch matrix 165 through segment switch matrix 161 to block switch matrix 266-A and in turn to programmable logic block 101-A defines a third hierarchical level.

Notice that a signal on the first hierarchical level does not require any resources of the second and third hierarchical levels. Similarly, signals that utilize the second hierarchical level do not require any resources of the third hierarchical level. Thus, for a given hierarchical level, resources for any higher hierarchical levels are not required.

FIG. 4B is the same as FIG. 4A, except FIG. 4B illustrates the layout of the various parts in a more compact representation. In one embodiment, hierarchical switch matrix 160 is implemented using a 0.5 micron, three-metal layer electrically erasable CMOS technology. In another embodiment, hierarchical switch matrix 160 is implemented using a 0.65 micron, two-metal layer electrically erasable CMOS technology.

The modular structure illustrated in FIG. 4A, combined with the fixed number of lines in each segment switch matrix and in global switch matrix 165 results in significantly easier scalability to higher density compared with the prior art interconnect methods. Further, the number of lines in the various switch matrices of hierarchical switch matrix 160 are only illustrative of the principles of this invention, and are not intended to limit the invention to the particular number of lines recited. In view of this disclosure those skilled in the art can implement hierarchical switch matrix 160 with various numbers of lines and various sizes of multiplexers or demultiplexers.

Figure 5:
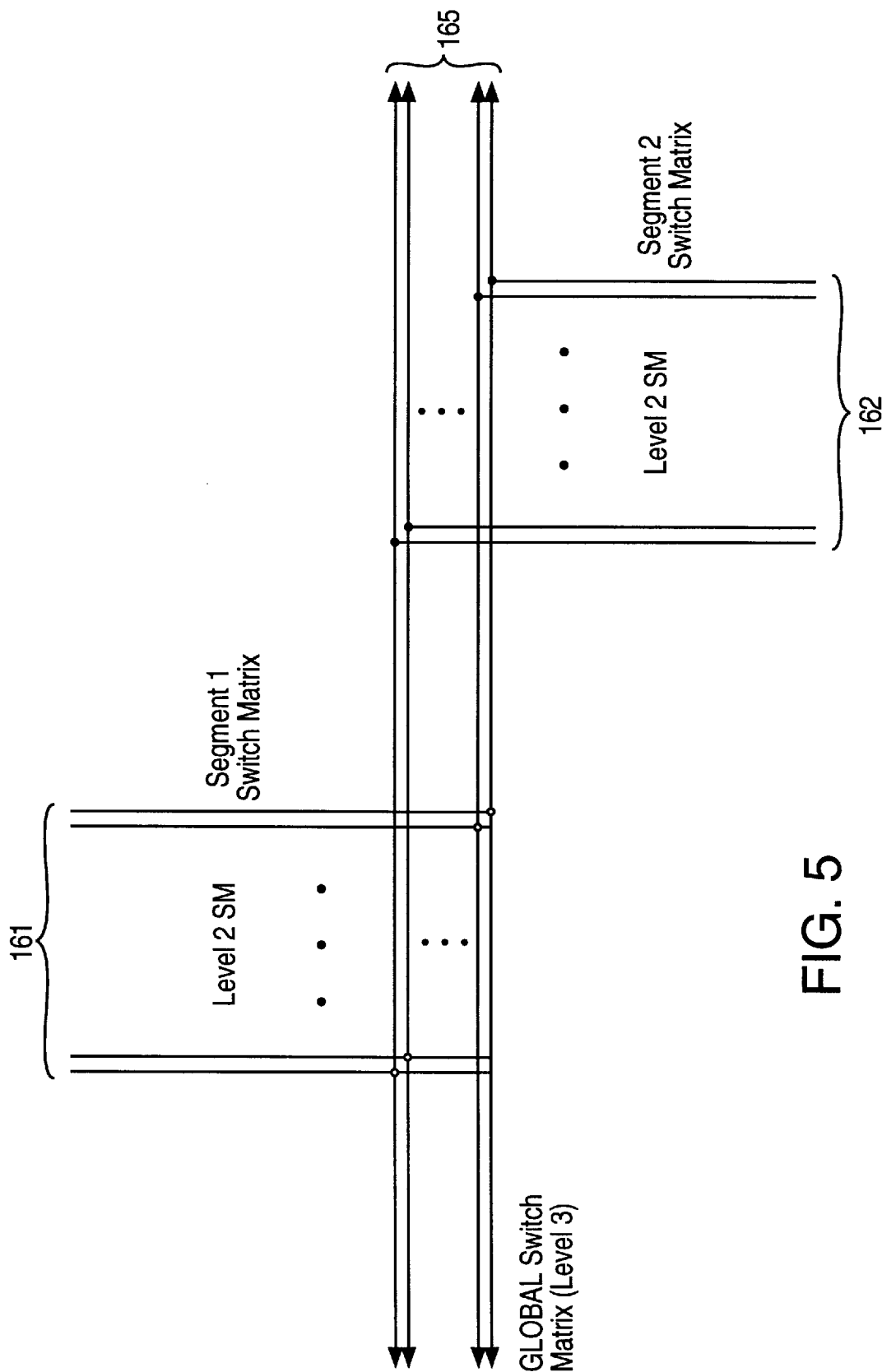
FIG. 5 illustrates one embodiment of the programmable interconnect between the segment switch matrices and the global switch matrix of this invention.

FIG. 5 is a more delayed layout for one embodiment of the global switch matrix 165 and segment switch matrices 161 and 162. The 128 lines of global switch matrix 165 are connected by programmable connections, e.g., pass transistors, to the 128-line bus of programmable segment switch matrix 161. The 128 lines of global switch matrix 165 are connected directly to the 128-line bus of programmable segment switch matrix 162.

Global switch matrix 165 can be easily extended to support a number of segments with no change to the basic architecture of a bus and programmable demultiplexers for each segment switch matrix. Each new segment is treated as completely independent and has its own interconnection pattern, i.e., programmable demultiplexer, with the global switch matrix 165.

The combination of a three-level programmable switch matrix with two of the levels implemented as programmable demultiplexers and the associated simple addition of segments has a significant affect on the speed aspect of an entire family of CPLDs that include the three-level hierarchical switch matrix. While a specific embodiment was described above, the timing delays described are generally applicable to a wide number of CPLDs with differing numbers of segments.

A local feedback signal to a programmable logic block through the programmable block switch matrix, i.e., a first level hierarchical signal, has a very fast signal propagation delay. Specifically, there is a one pass transistor delay for all intra-block signals. Similarly, a second level hierarchical signal, i.e., intra-segment signals, experience two pass transistor delays. Thus, all programmable logic blocks within a segment can communicate with each other and the signals experience a maximum of two pass transistor delays.

For a CPLD with only two segments, inter-segment signals, i.e., third level hierarchical signals, experience three-pass transistor delays and for CPLDs with more than two segments, inter-segment signals experience at least four-pass transistor delays. Thus, in a CPLD with 256 macrocells and maximum of 256 I/O pins, i.e, four segments, signals within one segment can communicate with any other segment with a worst case delay of four pass transistor delays. Herein, the time delays are characterized by the number of pass transistor delays. However, those skilled in the art will understand that the actual delay includes a component associated with the bus in the switch matrix.

As indicated above, the time delays through each level of hierarchical switch matrix 160 are a fixed, predictable, deterministic delay. In this embodiment, all segments are symmetric and exhibit similar timing characteristics, independent of the CPLD density. Thus, the time delay through a programmable logic block and a programmable block switch matrix is the same for all segments. Similarly, the time delay through a programmable logic block, a programmable block switch matrix, and a segment switch matrix is the same for all segments. The only timing characteristic that changes based on the density of the CPLD is the inter-segment communication speed. Of course, a CPLD could be built using the hierarchical structure of this invention with differing size segments as well as with different programmable logic blocks within a segment. For example, a programmable logic block in a segment could have all of the output lines tied to I/O pins of the CPLD, and another programmable logic block in the segment could only drive feedback lines.

In addition to the uniform speed characteristics associated with the symmetrical segments, the symmetrical segments and the independence of the segments with respect to the global switch matrix significantly enhance the ability to implement a CPLD of this invention in silicon via a step-and-repeat methodology. The independence of the global switch matrix size from the segment switch matrices allows the size of the global switch matrix to be changed without affecting the segment switch matrices. In the embodiment described above, the global switch matrix has 128 lines. However, the global switch matrix could also be implemented with 160, 192, or 256 lines, for example.

In another embodiment of this invention, each programmable logic block and each plurality of I/O pins for that programmable logic block provide feedback signals not only to the programmable logic block switch matrix, but also to an input switch matrix bank of an input switch matrix that in turn programmably connects and disconnects the feedback signals to a segment switch matrix.

Figure 6:
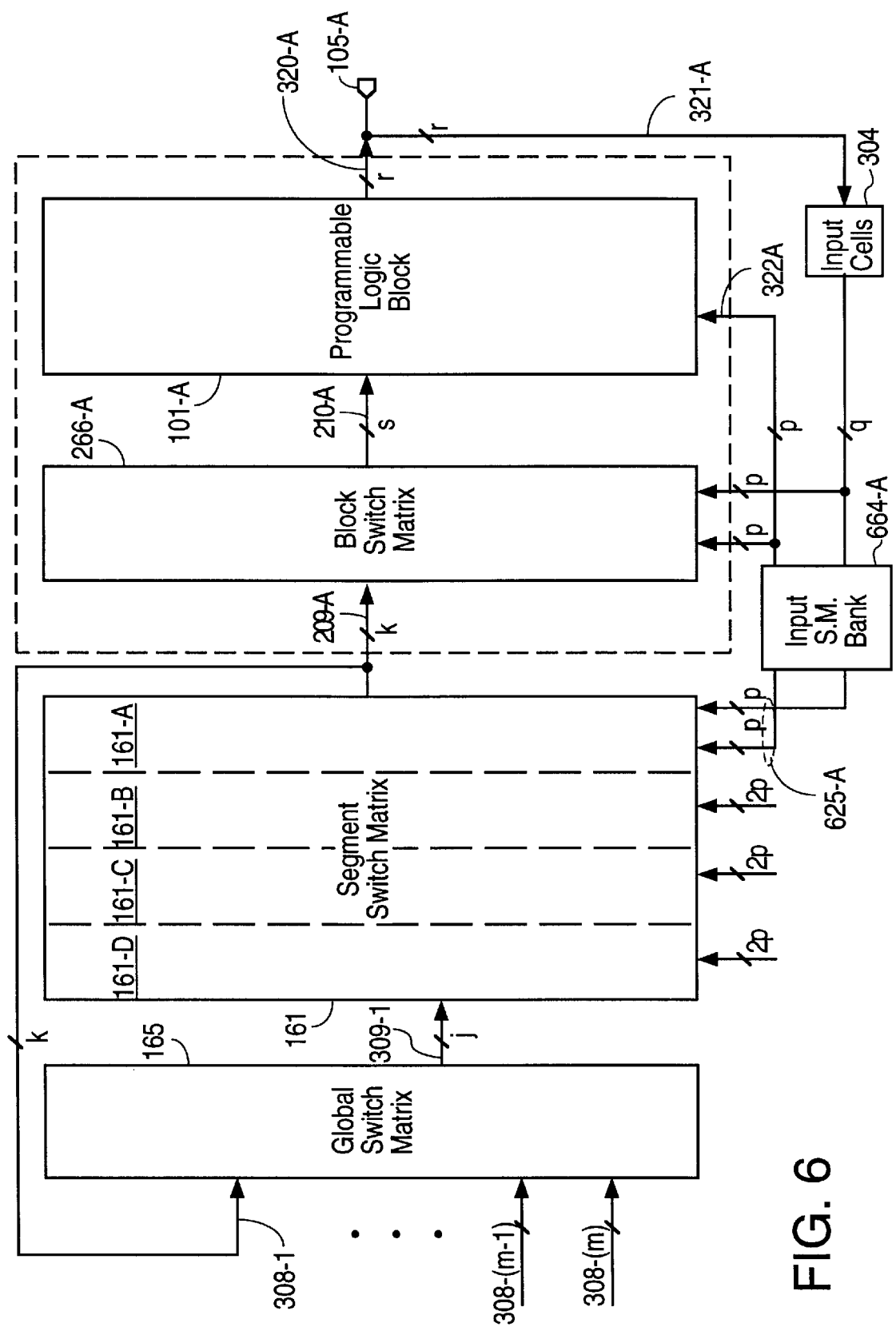
FIG. 6 is a detailed block diagram of one embodiment of the hierarchical switch matrix of this invention in a very high-density CPLD that includes both input cells and an input switch matrix.

FIG. 6 is a block diagram of a CPLD that includes hierarchical switch matrix 160 of this invention and an input switch matrix bank 664-A. Global switch matrix 165, segment switch matrix 161, block switch matrix 266-A and programmable logic block 101-A in FIG. 6 are identical to the same elements in FIG. 3 and so that description is incorporated herein by reference. The main difference between FIG. 3 and FIG. 6 is that input switch matrix bank 664-A has been added in the local feedback lines.

Specifically, programmable logic block 101-A drives r output lines 320-A that are connected to I/O pins 105-A. Feedback lines 321-A carry the signals on I/O pins 105-A to input cells 304-A. Programmable logic block 101-A also generates p macrocell feedback signals on lines 322-A that are provided to block switch matrix 266-A and to input switch matrix bank 664-A.

In one CPLD, input cells 304-A are simply a straight pass through so that the signals on r input lines 321-A are passed directly to q output lines 623-A. In another CPLD, each input line in r input lines 321-A either (i) drives directly one of (q/2) output lines in output lines 623-A to input switch matrix bank 364-A, or (ii) drives a programmably configurable storage element. Each programmably configurable storage element drives one of the other (q/2) output lines in output lines 623-A to input switch matrix bank 664-A. In this embodiment, input switch matrix bank 664-A drives 2*p lines 625-A to segment switch matrix strip 161-A.

Input switch matrix bank 664-A provides additional signal paths for each feedback signal to segment switch matrix 161 and so improves the overall routability of the CPLD. One embodiment of an input switch matrix suitable for use in this invention is disclosed in the commonly assigned U.S. patent application Ser. No. 07/924,685, entitled "Architecture of a Multiple Array High Density Programmable Logic Device With A Plurality of Programmable Switch Matrices," of Om P. Agrawal et al. filed on Aug. 3, 1992, now U.S. Pat. No. 5,457,409, issued on Oct. 10, 1995 and incorporated herein by reference in its entirety.

In the embodiments of hierarchical switch matrix 160 described above, hierarchical switch matrix 160 includes a global switch matrix, a plurality of segment switch matrices, i.e, one for each segment in the CPLD, and a plurality of block switch matrices, i.e., one for each programmable logic block in the CPLD, and a particular feedback configuration as well as a particular interconnection of the various hierarchical switch matrix levels. In view of this disclosure, use of various combinations of the levels of hierarchical switch matrix 160 as well as various combinations of feedback signal connections to the various combinations of levels is possible to achieve a desired combination of routability, die size, and speed. As the number and length of feedback lines are increased, the speed and silicon die size are most likely compromised. Similarly, as the multiplexer and/or programmable demultiplexer size is increased, the silicon die size and speed are affected. However, in applications where routability and rapid remapping of logic are important, a compromise on speed and silicon die size may be acceptable. Thus, some other possible implementations of hierarchical switch matrix 160 of this invention are discussed more completely below.

In view of the above description, only the basic interconnections for one programmable logic block in the CPLD are illustrated in FIGS. 7 to 11. The completion of a segment and the entire CPLD will be apparent to those skilled in the art in view of the above disclosure and the information that follows.

Figure 7:
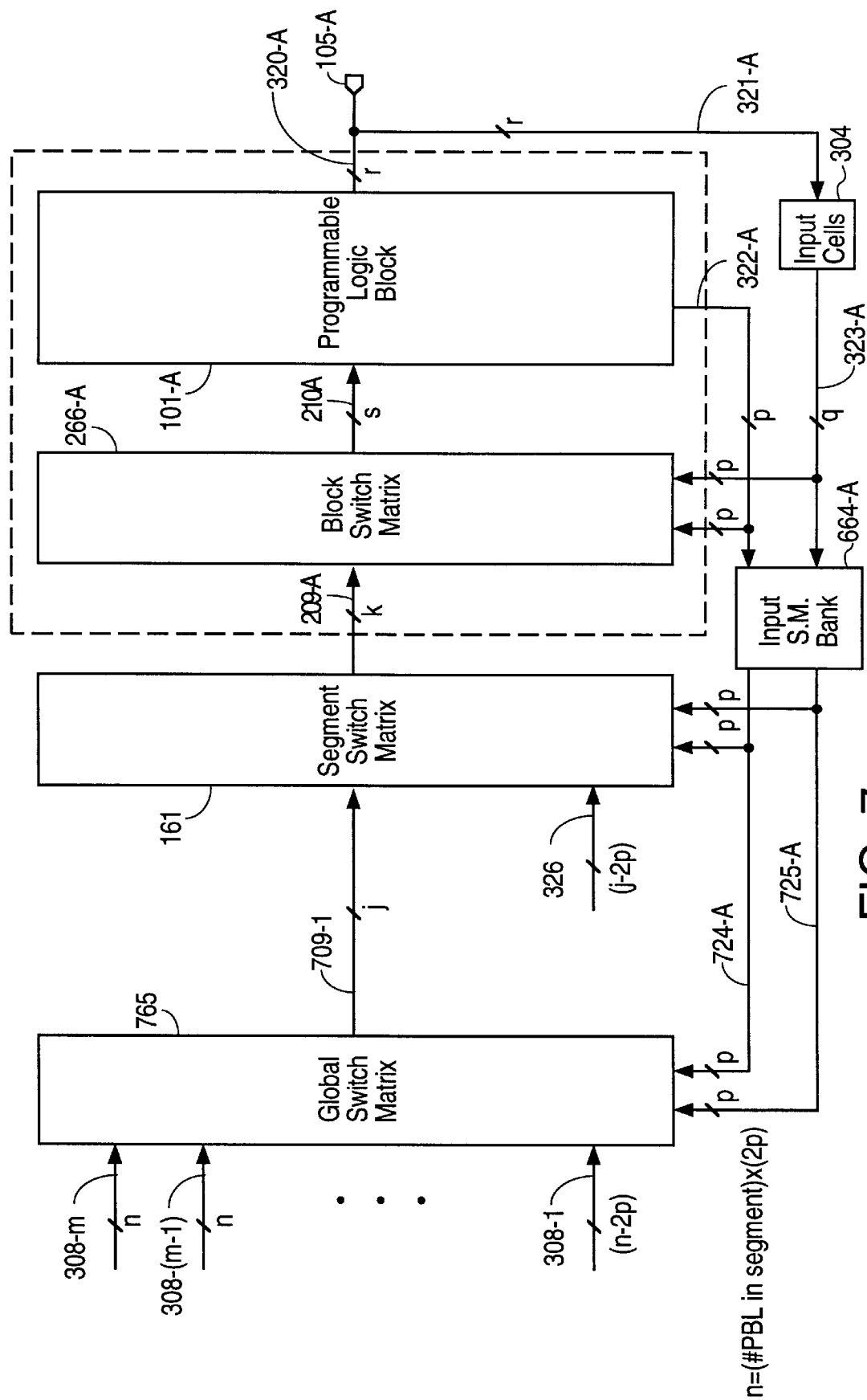
FIG. 7 is a block diagram of another embodiment of the hierarchical switch matrix of this invention that includes a global switch matrix, a segment switch matrix, and block switch matrices with the local feedback through all three-levels of the hierarchical switch matrix.

FIG. 7 is a block diagram of an alternative embodiment of a three-level switch matrix 160 of this invention. Segment switch matrix 161, block switch matrix 266-A, and programmable logic block 101-A are similar to those described above. However, in this embodiment, segment switch matrix 161 is connected to global switch matrix 765 by j lines 709-1 and there is no bus connecting the output lines of segment switch matrix 161 to the input lines of global switch matrix 765.

Programmable logic block 101-A again drives r output lines 320-A that are connected to I/O pins 105-A. Feedback lines 321-A carry the signals on I/O pins 105-A to input cells 304-A, that have the various embodiments described above. Programmable logic block 101-A also generates p macrocell feedback signals on lines 322-A that are connected directly to block switch matrix 266-A and to input switch matrix 664-A. In one embodiment, the S input lines 210-A to programmable logic block 101-A are thirty-two input lines.

In this embodiment, input switch matrix bank 664-A drives p lines 725-A to global switch matrix and to segment switch matrix 161, and p-lines 724-A to global switch matrix 765 and to segment switch matrix 161. In another embodiment (not shown), input switch matrix bank 664-A is eliminated and the lines from input cells 304-A and the macrocell feedback lines are connected directly to segment switch matrix 161 and global switch matrix 765. In the embodiments both with and without the input switch matrix bank, global switch matrix 765 receives m groups of input signals 308-1 to 308-m where m is the number of segments in the CPLD.

Figure 10:
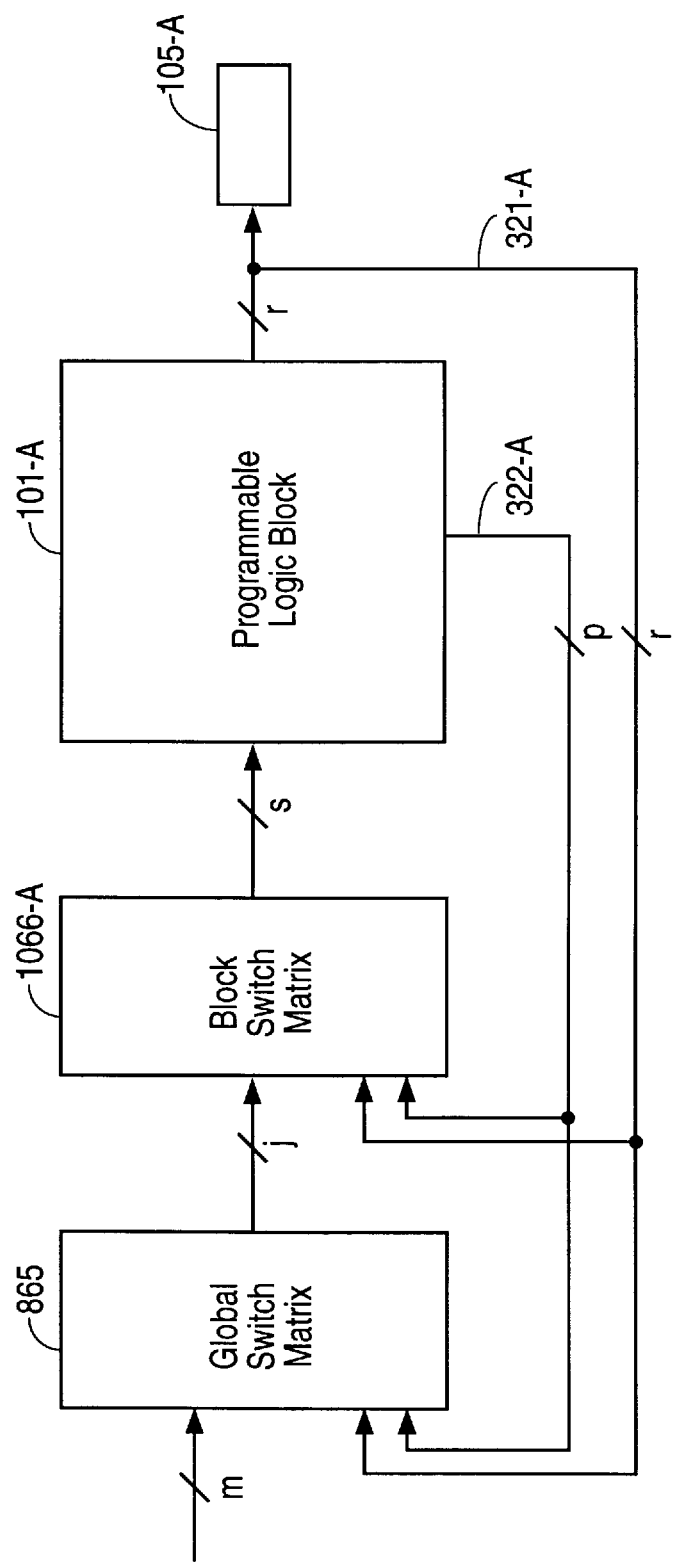
FIG. 10 is a block diagram of an embodiment of the hierarchical switch matrix of this invention that includes a global switch matrix and block switch matrices with the local feedback routed to both the global switch matrix and the block switch matrix.

Each group of global switch matrix input signals 308-i includes n signals where n is the number of programmable logic blocks in the segment multiplied by the number of input lines to global switch matrix 765 from a programmable logic block, which in FIG. 10 is 2p lines. Thus, in this embodiment, global switch matrix 765 receives a total of m*n signals.

Global switch matrix 765 receives all the I/O pin signals and all macrocell feedback signals, and routes these signals to appropriate segment switch matrices. In one embodiment n is 128 (2 feedback lines×16 macrocells per PLB×4 PLBs per segment) and the number of segments m is four. Thus, in this embodiment, global switch matrix has a total of 512 input signals.

As explained above, segment switch matrix 161 receives j signals from global switch matrix 765 and j signals from the all the programmable logic blocks within its own segment. Thus, in this embodiment, up to 50% of the input signals to segment switch matrix 161 can be from other segments.

Figure 8:
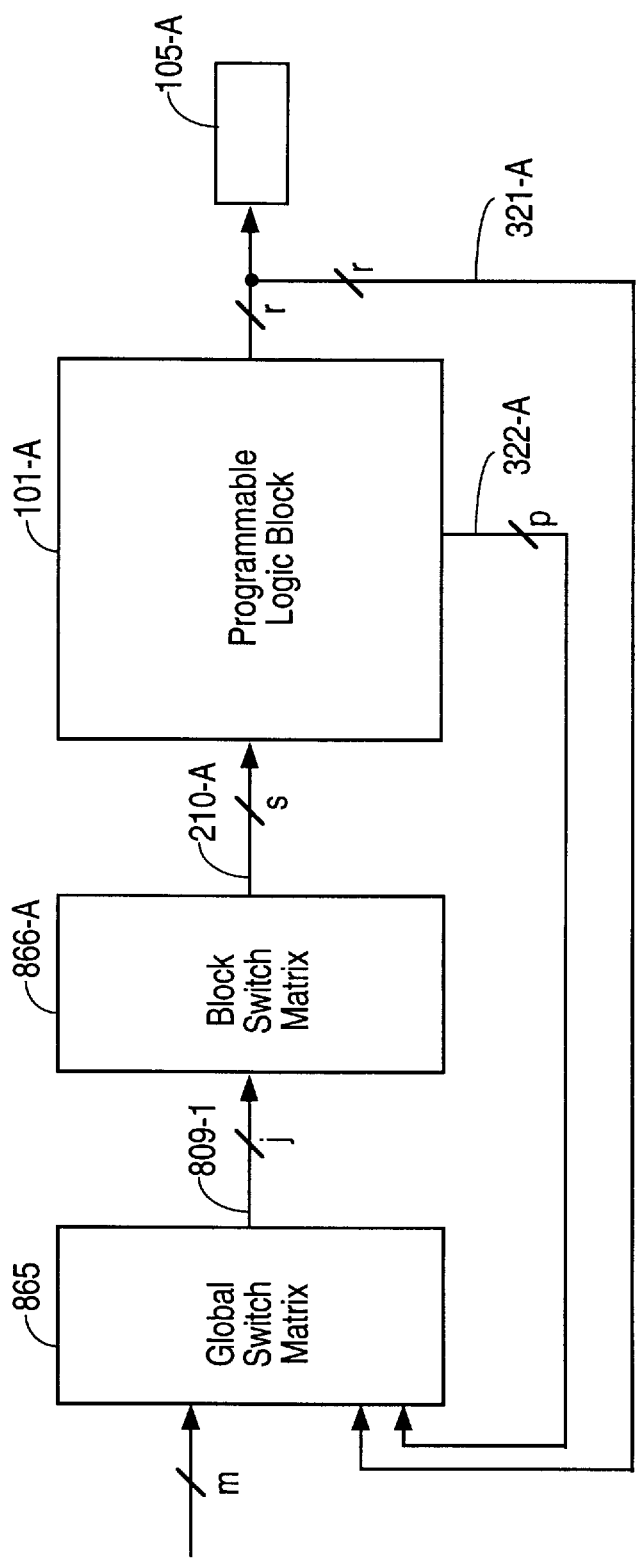
FIG. 8 is a block diagram of an embodiment of the hierarchical switch matrix of this invention that includes a global switch matrix and block switch matrices with the local feedback through the global switch matrix.

FIG. 8 is a block diagram of an embodiment of a two-stage hierarchical switch matrix of this invention that includes a global switch matrix 865 and one programmable block switch matrix 866-A for each programmable logic block 101-A in the CPLD. The programmable logic blocks are not grouped into segments. The programmable logic block feedback signals on lines 322-A and the I/O pin feedback signals one lines 321-A are routed directly to global switch matrix 865. There is not a fast direct local feedback path through block switch matrix 866-A. The major benefit of this embodiment is to break routing congestion for signals driving the block switch matrices.

Figure 9:
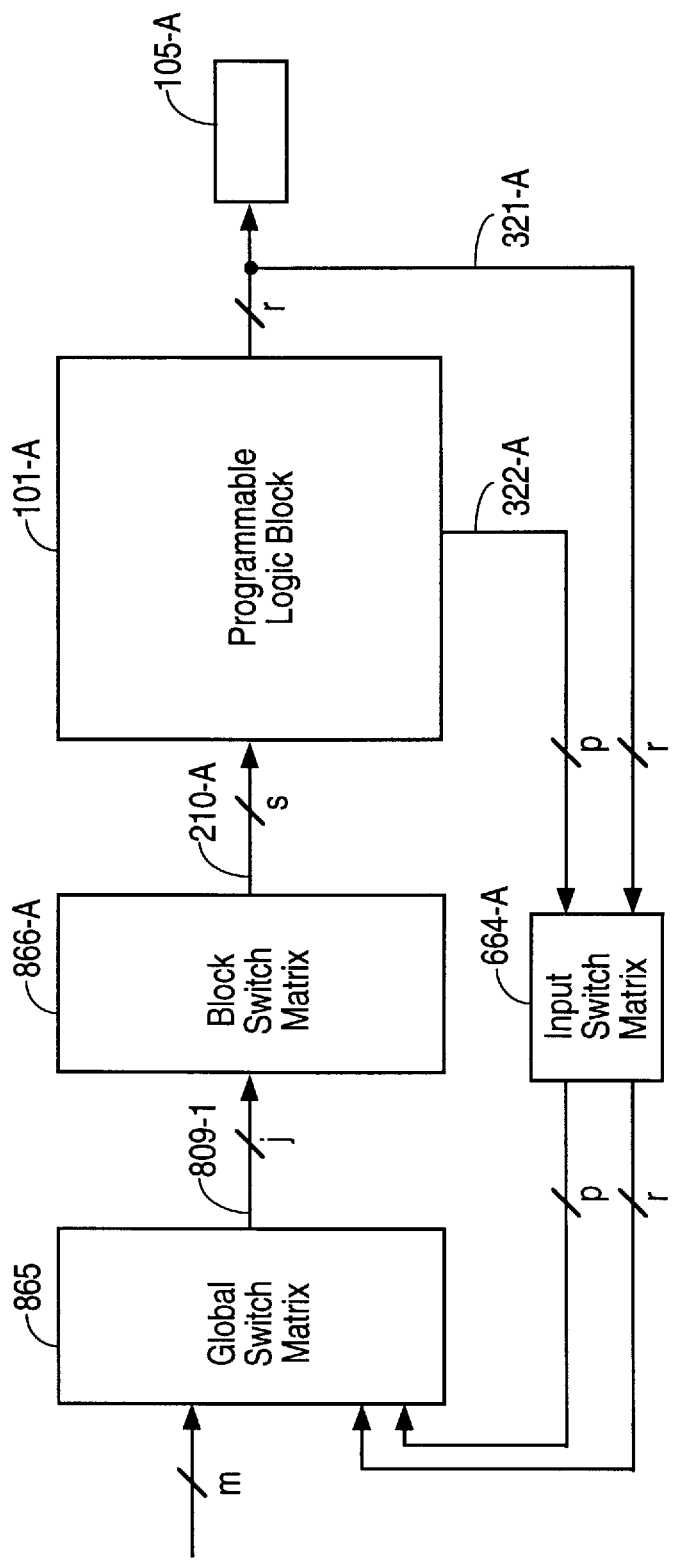
FIG. 9 is a block diagram of an embodiment of the hierarchical switch matrix of this invention that includes a global switch matrix and block switch matrices with an input switch matrix where the local feedback is routed through the input switch matrix to the global switch matrix.

FIG. 9 is a block diagram of the embodiment of the hierarchical switch matrix of FIG. 8 with an associated input switch matrix 664-A. The programmable logic block feedback signals are routed through input switch matrix 664-A to global switch matrix 965. The major advantage of this approach is potentially increased routing flexibility. Specifically, input switch matrix 664-A increases the overall routing flexibility at the expense of some additional interconnect delays.

FIG. 10 is a block diagram of yet another embodiment of a two-stage hierarchical switch matrix of this invention that includes a global switch matrix 865 and one programmable block switch matrix 1066-A for each programmable logic block 101-A in the CPLD. The programmable logic blocks are not grouped into segments. The programmable logic block feedback signals on lines 322-A and the I/O pin feedback signals one lines 321-A are routed directly to both programmable block switch matrix 1066-A and programmable global switch matrix 865. Thus, in this embodiment, there are two feedback paths through the hierarchical switch matrix, a fast local feedback path through block switch matrix 1066-A and a global feedback path through global switch matrix 865.

Figure 11:
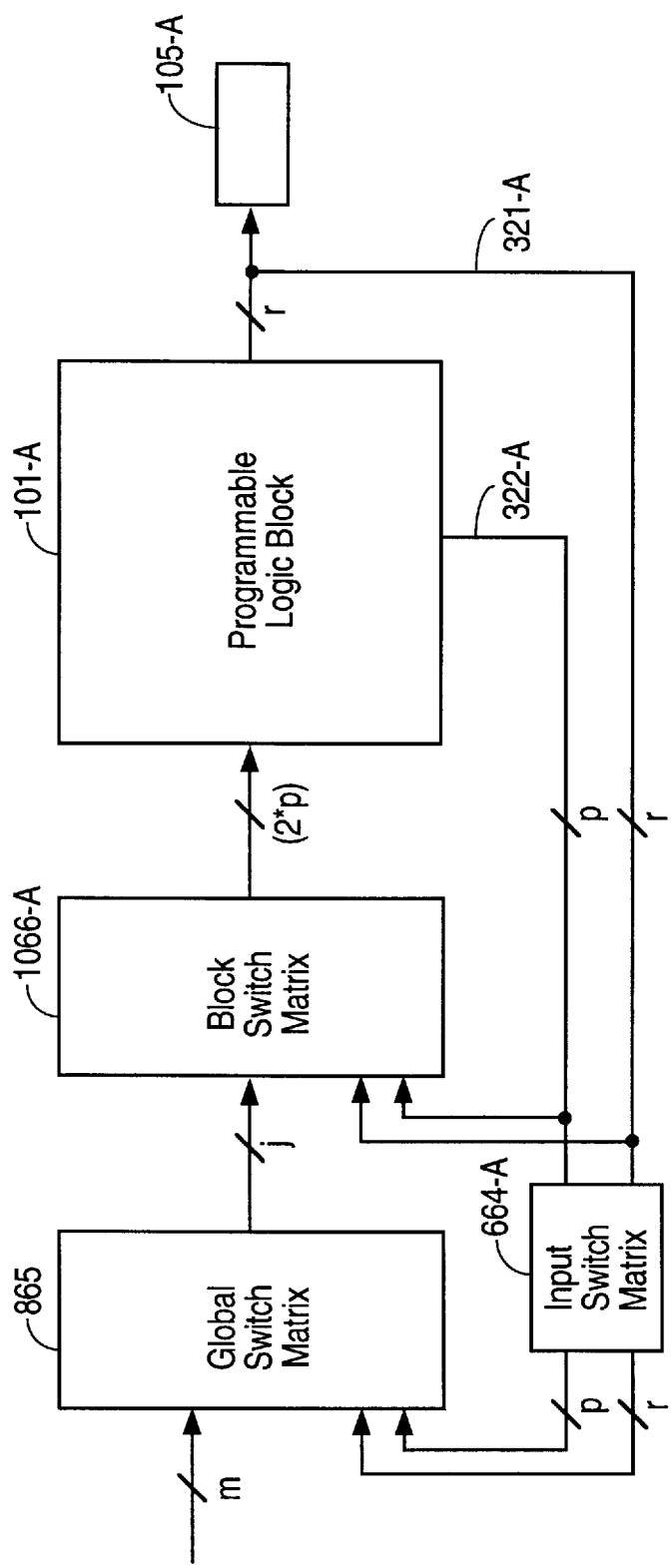
FIG. 11 is a block diagram of an embodiment of the hierarchical switch matrix of this invention that includes a global switch matrix and block switch matrices with an input switch matrix where the local feedback is routed to the block switch matrix and is routed through the input switch matrix to the global switch matrix.

FIG. 11 is a block diagram of the embodiment of the hierarchical switch matrix of FIG. 10 with an associated input switch matrix 664-A. The programmable logic block feedback signals are still provided directly to block switch matrix 1066-A, but the feedback signals to global switch matrix 865 are routed through input switch matrix 664-A for increased global routing flexibility.

An important aspect of the hierarchical switch matrix of this invention is that each group of signals passes through the same number of elements in the switch matrix. Consequently, the signal delay time for each group of signals is fixed, path independent, uniform, predictable and deterministic. Therefore, the designer knows the time delay upon identifying the feedback signal source. This facilitates software design for programming hierarchical switch matrix 160 as well as user development. Another important aspect of this invention is that the multi-level hierarchical switch matrix can function as (i) a single switch matrix for a programmable logic block, (ii) a centralized switch matrix for a segment and (iii) a global switch matrix for multiple segments.

The embodiments described above are only illustrative of the principles of this invention and are not intended to limit the invention to the particular embodiments described. In view of these disclosures, the CPLDs described above could be implemented with segments of a smaller size with a corresponding adjustment to the hierarchical switch matrix. Further, the hierarchical switch matrix may be implemented with a wide variety of programmable multiplexer sizes.

We claim:

1. In an integrated circuit having a plurality of programmable logic circuits wherein each programmable logic circuit includes a plurality of input lines and a plurality of output lines, a programmable hierarchical switch matrix comprising:

(i) a first programmable switch matrix having a multiplicity of output lines and a multiplicity of input lines;
wherein said first programmable switch matrix selectively connects and disconnects each line in said multiplicity of said programmable first switch matrix input lines to and from at least one line in said multiplicity of first programmable switch matrix output lines;
said first programmable switch matrix output lines are connected to a plurality of input lines of one of said plurality of programmable logic circuits;
and a signal path through said first programmable switch matrix and said one of said plurality of programmable logic circuits defines a first level of said hierarchical switch matrix;

(ii) a second programmable switch matrix having:
a multiplicity of programmable demultiplexers wherein each programmable demultiplexer has an input terminal and N output terminals, where N is an integer, and each programmable demultiplexer selectively connects said input terminal to one of said N output terminals and disconnects remaining output terminals of said N output terminals from said input terminal;
a multiplicity of input lines wherein each input line is connected to one input terminal of one demultiplexer in said plurality of demultiplexers; and
a multiplicity of output lines wherein each output line is connected to an output terminal of at least one demultiplexer in said plurality of demultiplexers;
wherein a set of output lines in said multiplicity of said second programmable switch matrix output lines is coupled to a set of input lines in said multiplicity of said programmable first switch matrix input lines so that another signal path through said second programmable switch matrix, said first programmable switch matrix, and said one of said plurality of programmable logic circuits defines another level of said hierarchical switch matrix; and
a set of output lines in a plurality of output lines of said one of said plurality of programmable logic circuits is coupled to a group of input lines in said multiplicity of input lines of said programmable second switch matrix so that a signal from said programmable logic circuit has a signal route to said second programmable switch matrix without passing through said first switch matrix.

2. The programmable hierarchical switch matrix as in claim 1 wherein said second programmable switch matrix is a programmable segment switch matrix.

3. The programmable hierarchical switch matrix as in claim 1 wherein said second programmable switch matrix is a programmable global switch matrix.

4. The programmable hierarchical switch matrix as in claim 1 wherein said set of said plurality of output lines of said one of said programmable logic circuits is connected to a first group of lines in said multiplicity of input lines of said first programmable switch matrix.

5. The programmable hierarchical switch matrix as in claim 4 wherein said set of said plurality of output lines of said one of said programmable logic circuits includes a plurality of macrocell feedback lines.

6. The programmable hierarchical switch matrix as in claim 4 wherein said set of said plurality of output lines of said one of said programmable logic circuits includes a plurality of I/O pin feedback lines.

7. The programmable hierarchical switch matrix as in claim 1 wherein said set of output lines in said plurality of output lines of said one of said programmable logic circuits includes a plurality of macrocell feedback lines.

8. The programmable hierarchical switch matrix as in claim 1 wherein said set of output lines in said plurality of output lines of said one of said programmable logic circuits includes a set of I/O pin feedback lines.

9. The programmable hierarchical switch matrix as in claim 1 wherein said multiplicity of programmable demultiplexers and said multiplicity of input lines of said second programmable switch matrix are arranged in a plurality of strips wherein each strip is associated with one of said plurality of programmable logic circuits.

10. The programmable hierarchical switch matrix as in claim 1 wherein said plurality of programmable logic circuits includes four programmable logic circuits.

11. The programmable hierarchical switch matrix as in claim 1 further comprising:

(iii) a third programmable switch matrix having a multiplicity of input lines and a multiplicity of output lines;
wherein said third programmable switch matrix selectively connects and disconnects each line in said multiplicity of said third programmable switch matrix input lines to and from at least one line in said multiplicity of said third programmable switch matrix output lines;
a set of output lines in said multiplicity of said third programmable switch matrix output lines is connected to a set of input lines in said multiplicity of said programmable second switch matrix input lines so that yet another signal path through said third programmable switch matrix, said second programmable switch matrix, said first programmable switch matrix, and said one of said plurality of programmable logic circuits defines yet another level of said hierarchical switch matrix.

12. The programmable hierarchical switch matrix as in claim 11 wherein said plurality of output lines of said one of said programmable logic circuits is connected to a first group of lines in said multiplicity of input lines of said first programmable switch matrix.

13. The hierarchical switch matrix of claim 11 wherein said multiplicity of output lines and said multiplicity of input lines of said third programmable switch matrix are a single multiplicity of bidirectional signal lines.

14. The programmable hierarchical switch matrix as in claim 11 wherein said multiplicity of output lines of said second programmable switch matrix is a group of input lines in said multiplicity of input lines of said third programmable switch matrix.

15. The programmable hierarchical switch matrix as in claim 11 wherein said multiplicity of programmable demultiplexers and said multiplicity of input lines of said second programmable switch matrix are arranged in a plurality of strips wherein each strip is associated with one of said plurality of programmable logic circuits.

16. The programmable hierarchical switch matrix as in claim 15 wherein said plurality of programmable logic circuits includes four programmable logic circuits.

17. In an integrated circuit having a plurality of programmable logic circuits wherein each programmable logic circuit includes a plurality of input lines and a plurality of output lines, a programmable hierarchical switch matrix comprising:

(i) a first programmable switch matrix having a multiplicity of output lines and a multiplicity of input lines;
wherein said first programmable switch matrix selectively connects and disconnects each line in said multiplicity of said programmable first switch matrix input lines to and from at least one line in said multiplicity of first programmable switch matrix output lines;
said first programmable switch matrix output lines are connected to a plurality of input lines of one of said plurality of programmable logic circuits; and
a signal path through said first programmable switch matrix and said one of said plurality of programmable logic circuits defines a first level of said hierarchical switch matrix;

(ii) a second programmable switch matrix having:
a multiplicity of programmable demultiplexers wherein each programmable demultiplexer has an input terminal and N output terminals, where N is an integer, and each programmable demultiplexer selectively connects said input terminal to one of said N output terminals and disconnects remaining output terminals of said N output terminals from said input terminal;
a multiplicity of input lines wherein each input line is connected to one input terminal of one demultiplexer in said plurality of demultiplexers; and
a multiplicity of bidirectional signal lines wherein each line in said multiplicity of bidirectional signal lines is coupled to an output terminal of one of said programmable demultiplexers;
wherein a set of bidirectional signal lines in said multiplicity of said second programmable switch matrix bidirectional signal lines is coupled to a set of input lines in said multiplicity of said programmable first switch matrix input lines so that another signal path through said second programmable switch matrix, said first programmable switch matrix, and said one of said plurality of programmable logic circuits defines another level of said hierarchical switch matrix; and
a set of output lines in a plurality of output lines of said one of said plurality of programmable logic circuits is coupled to a group of input lines in said multiplicity of input lines of said programmable second switch matrix so that a signal from said programmable logic circuit has a signal route to said second programmable switch matrix without passing through said first switch matrix.

18. The programmable hierarchical switch matrix as in claim 17 wherein said second programmable switch matrix is a programmable global switch matrix.

19. The programmable hierarchical switch matrix as in claim 17 wherein said set of output lines in said plurality of output lines of said one of said programmable logic circuits is connected to a first group of lines in said multiplicity of input lines of said first programmable switch matrix.

20. The programmable hierarchical switch matrix as in claim 19 wherein said set of output lines in said plurality of output lines of said one of said programmable logic circuits includes a plurality of macrocell feedback lines.

21. The programmable hierarchical switch matrix as in claim 19 wherein said set of output lines in said plurality of output lines of said one of said programmable logic circuits includes a plurality of I/O pin feedback lines.

22. In a very high density programmable logic device, a hierarchical switch matrix comprising:

(i) a programmable block switch matrix having a multiplicity of input lines and a multiplicity of output lines;
wherein said programmable block switch matrix selectively connects and disconnects each line in said multiplicity of programmable block switch matrix input lines to and from at least one line in said multiplicity of programmable block switch matrix output lines;
said programmable block switch matrix output lines are connected to a plurality of input lines of one of a plurality of programmable logic blocks; and
a first signal path through said first programmable switch matrix and said one of said plurality of programmable logic blocks defines a first level of said hierarchical switch matrix;

(ii) a programmable segment switch matrix having a multiplicity of input lines and a first bidirectional bus;
wherein said programmable segment switch matrix selectively connects and disconnects each line in said multiplicity of programmable segment switch matrix input lines to and from at least one line in said first bidirectional bus;
a set of lines in said plurality of output lines of said one of said plurality of programmable logic blocks is connected to a first group of lines in said multiplicity of input lines of said programmable segment switch matrix so that signals from said one of said plurality of programmable logic blocks are provided to said programmable segment switch matrix without passing through the programmable block switch matrix;
said multiplicity of programmable block switch matrix input lines is connected to said first bidirectional bus; and
a second signal path through said programmable segment switch matrix, said programmable block switch matrix, and said one of said plurality of programmable logic blocks defines a second level of said hierarchical switch matrix; and (iii) a programmable global switch matrix having a multiplicity of bidirectional signal lines;
wherein said programmable global switch matrix selectively connects and disconnects each line in said multiplicity of programmable global switch matrix bidirectional signal lines to and from at least one line in said first bidirectional bus; and
a third signal path through said programmable global switch matrix, said programmable segment switch matrix, said programmable block switch matrix, and said one of said plurality of programmable logic blocks defines a third level of said hierarchical switch matrix.

23. The hierarchical switch matrix of claim 22 wherein said set of lines in said plurality of output lines of said one of said plurality of programmable logic blocks is connected to a first group of lines in said multiplicity of input lines of said programmable block switch matrix.

24. The hierarchical switch matrix of claim 22 wherein said plurality of output lines of another one of said plurality of programmable logic blocks is connected to a second group of lines in said multiplicity of input lines of said programmable segment switch matrix.

25. The hierarchical switch matrix of claim 22 wherein said multiplicity of bidirectional signal lines of said programmable global switch matrix comprises:
   a second bidirectional bus; and said programmable global switch matrix further comprises:
   a plurality of programmable demultiplexers wherein each demultiplexer has an input terminal connected to a line in said first bidirectional bus; a first output terminal connected to a line in said second bidirectional bus; and a second output terminal connected to another line in said second bidirectional bus.

26. The hierarchical switch matrix of claim 22 wherein said multiplicity of bidirectional signal lines of said programmable global switch matrix comprises:
   a second bidirectional bus; and programmable global switch matrix further comprises:
   a plurality of programmable demultiplexers wherein each demultiplexer has an input terminal connected to a line in said second bidirectional bus; a first output terminal connected to a first line in said first bidirectional bus; and a second output terminal connected to another line in said first bidirectional bus.

27. The hierarchical switch matrix of claim 22 wherein said programmable segment switch matrix comprises:
   a programmable demultiplexer having an input terminal connected to a line in said multiplicity of programmable segment switch matrix input lines; a first output terminal connected to a line in said first bidirectional bus; and a second output terminal connected to another line in said first bidirectional bus.

28. The hierarchical switch matrix of claim 22 wherein said programmable block switch matrix comprises a plurality of programmable multiplexers with each programmable multiplexer having a plurality of input lines and an output line so that said plurality of programmable multiplexers have pluralities of input lines and a plurality of output lines; and further wherein said multiplicity of output lines of said programmable block switch matrix includes said plurality of output lines of said plurality of programmable multiplexers and said multiplicity of input lines of said programmable block switch matrix includes said pluralities of input lines of said plurality of programmable multiplexers.

29. In a very high density programmable logic device, a hierarchical switch matrix comprising:
   (i) a programmable block switch matrix having a multiplicity of input lines and a multiplicity of output lines; wherein said programmable block switch matrix selectively connects and disconnects said multiplicity of input lines to said multiplicity of output lines; and
   a signal path through said programmable block switch matrix, and one of a plurality of programmable logic blocks connected to said multiplicity of output lines of said programmable block switch matrix defines a first level of said hierarchical switch matrix and further wherein any other level of said hierarchical switch matrix includes said first level within said any other level; and
   (ii) a programmable global switch matrix having a multiplicity of output lines and a multiplicity of input lines; wherein said programmable global switch matrix selectively connects and disconnects said multiplicity of programmable switch matrix input lines to said multiplicity of programmable global switch matrix output lines;
   said multiplicity of output lines of said programmable global switch matrix is coupled to said multiplicity of input lines of said programmable block switch matrix;
   a set of input lines in said multiplicity of input lines of said programmable global switch matrix is connected to a plurality of output lines of said one of a plurality of programmable logic blocks so that signals from said one of said plurality of programmable logic blocks are provided to said programmable global switch matrix without passing through the programmable block switch matrix; and
   another signal path through said programmable global switch matrix, said programmable block switch matrix, and said one of a plurality of programmable logic blocks defines another level of said hierarchical switch matrix so that said another level includes said first level.

30. The hierarchical switch matrix of claim 29 wherein a plurality of output lines of said one of said plurality of programmable logic circuits is connected to a first group of lines in said multiplicity of input lines of said programmable block switch matrix.

31. The hierarchical switch matrix of claim 29 wherein said multiplicity of output lines and said multiplicity of input lines of said programmable global switch matrix are a single multiplicity of bidirectional signal lines.

32. The hierarchical switch matrix of claim 29 wherein said programmable block switch matrix comprises a plurality of programmable multiplexers with each programmable multiplexer having a plurality of input lines and an output line so that said plurality of programmable multiplexers have pluralities of input lines and a plurality of output lines; and further wherein said multiplicity of output lines of said programmable block switch matrix is said plurality of output lines of said plurality of programmable multiplexers and said multiplicity of input lines of said programmable block switch matrix is said pluralities of input lines of said plurality of programmable multiplexers.

33. The hierarchical switch matrix of claim 29 wherein said coupling of said multiplicity of output lines of said programmable global switch matrix to said multiplicity of input lines of said programmable block switch matrix is a direct connection of said multiplicity of output lines of said programmable global switch matrix to said multiplicity of input lines of said programmable block switch matrix.

34. In a very high density programmable logic device, a hierarchical switch matrix comprising:
   (i) a programmable block switch matrix having a multiplicity of input lines and a multiplicity of output lines; wherein said programmable block switch matrix selectively connects and disconnects said multiplicity of input lines to said multiplicity of output lines; and
   a signal path through said programmable block switch matrix and one of a plurality of programmable logic circuits defines a first level of said hierarchical switch matrix and further wherein any other level of said hierarchical switch matrix includes said first level within said any other level; and
   (ii) a programmable segment switch matrix having a multiplicity of output lines and a multiplicity of input lines;
   wherein said programmable segment switch matrix selectively connects and disconnects said multiplicity of programmable segment switch matrix input lines to said multiplicity of programmable segment switch matrix output lines;

said multiplicity of output lines of said programmable segment switch matrix is connected to said multiplicity of input lines of said programmable block switch matrix;

a plurality of output lines of said one of said plurality of programmable logic circuits is connected to a group of lines in said multiplicity of input lines of said programmable segment switch matrix so that signals from said one of said plurality of programmable logic circuits are provided to said programmable segment switch matrix without passing through the programmable block switch matrix; and another signal path through said programmable segment switch matrix, said programmable block switch matrix, and one of a plurality of programmable logic circuits defines another level of said hierarchical switch matrix so that said another level includes said first level.

35. The hierarchical switch matrix of claim 34 wherein a plurality of output lines of said one of said plurality of programmable logic circuits is connected to a first group of lines in said multiplicity of input lines of said programmable block switch matrix.

36. The hierarchical switch matrix of claim 34 wherein said programmable segment switch matrix comprises:

a bus; and a programmable demultiplexer having an input terminal connected to a line in said multiplicity of programmable segment switch matrix input lines; a first output terminal connected to a line in said bus; and a second output terminal connected to another line in said bus.

37. The hierarchical switch matrix of claim 34 wherein said programmable block switch matrix comprises a plurality of programmable multiplexers with each programmable multiplexer having a plurality of input lines and an output line so that said plurality of programmable multiplexers have pluralities of input lines and a plurality of output lines; and further wherein said multiplicity of output lines of said programmable block switch matrix is said plurality of output lines of said plurality of programmable multiplexers and said multiplicity of input lines of said programmable block switch matrix is said pluralities of input lines of said plurality of programmable multiplexers.

38. A method for interconnecting programmable logic blocks that is scalable from a CPLD having a first number of said programmable logic blocks to another CPLD having a second number of said programmable logic blocks comprising:

arranging said programmable logic blocks in a CPLD into segments wherein each segment includes a plurality of said programmable logic blocks;

interconnecting said plurality of programmable logic blocks in each segment to a programmable segment switch matrix;

wherein said programmable segment switch matrix in each segment is independent from said segment switch matrix in each of said other segments; and said plurality of programmable logic blocks within said segment communicate only through said segment switch matrix; and interconnecting each programmable segment switch matrix to a bi-directional bus of a programmable global switch matrix wherein a programmable logic block in one segment communicates with a programmable logic block in another segment through said global switch matrix; and another segment can be added to said CPLD without affecting other segments in said CPLD by interconnecting a segment switch matrix in said another segment to said bi-directional bus of said global switch matrix and so said method of interconnecting is scalable.

39. A method as in claim 38 wherein said operation of interconnecting each programmable segment switch matrix to a programmable global switch matrix further comprises:

connecting output terminals of a programmable demultiplexer to input lines of said programmable segment switch matrix; and connecting an input terminal of said programmable demultiplexer to a line in a bi-directional bus of said programmable global switch matrix.

40. A method as in claim 38 wherein said operation of interconnecting said plurality of programmable logic blocks in each segment to a programmable segment switch matrix further comprises:

connecting an input terminal of a programmable demultiplexer to an output line of one of said programmable logic block;

connecting a first output terminal of said programmable demultiplexer to a line in a bus of said programmable segment switch matrix;

connecting a second output terminal of said programmable demultiplexer to another line in said bus of said programmable segment switch matrix.

41. A method as in claim 38 wherein said operation of interconnecting said plurality of programmable logic blocks in each segment to a programmable segment switch matrix further comprises:

arranging said programmable segment switch matrix in strips wherein each strip communicates with a different programmable logic block in said segment.

* * * * *